United States Patent
Burrows et al.

(10) Patent No.: US 8,926,119 B2
(45) Date of Patent: Jan. 6, 2015

(54) EXTENDABLE LIGHT SOURCE WITH VARIABLE LIGHT EMITTING AREA

(75) Inventors: Paul E. Burrows, Chattaroy, WA (US); Ruiqing Ma, Morristown, NJ (US); Jason Paynter, Bristol, PA (US)

(73) Assignee: Universal Display Corporation, Ewing, NJ (US)

(*) Notice: Subject to any disclaimer, the term of this patent is extended or adjusted under 35 U.S.C. 154(b) by 720 days.

(21) Appl. No.: 13/198,385

(22) Filed: Aug. 4, 2011

(65) Prior Publication Data

US 2013/0033185 A1   Feb. 7, 2013

(51) Int. Cl.
| | | |
|---|---|---|
| *F21V 21/00* | (2006.01) | |
| *H05B 37/02* | (2006.01) | |
| *H05B 33/08* | (2006.01) | |
| *F21V 14/02* | (2006.01) | |
| *H01L 27/32* | (2006.01) | |
| *F21S 6/00* | (2006.01) | |
| *F21Y 105/00* | (2006.01) | |

(52) U.S. Cl.
CPC ............ *H05B 37/02* (2013.01); *H05B 33/0896* (2013.01); *F21V 14/02* (2013.01); *H01L 27/3202* (2013.01); *H01L 27/3204* (2013.01); *H01L 2251/5338* (2013.01); *H01L 2251/5361* (2013.01); *F21S 6/003* (2013.01); *F21Y 2105/008* (2013.01)
USPC .................................................. 362/217.14

(58) Field of Classification Search
CPC ........................................................ H01L 27/12
USPC ................. 315/294, 209 R, 312; 362/217.14, 362/217.16, 217.17, 227, 249.01, 249.02, 362/285, 800; 257/80, 81, 82
See application file for complete search history.

(56) References Cited

U.S. PATENT DOCUMENTS

| | | | |
|---|---|---|---|
| 4,769,292 A | 9/1988 | Tang et al. | |
| 5,061,569 A | 10/1991 | VanSlyke et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |

(Continued)

FOREIGN PATENT DOCUMENTS

| | | |
|---|---|---|
| EP | 0650955 | 5/1995 |
| EP | 1725079 | 11/2006 |

(Continued)

OTHER PUBLICATIONS

Baldo et al., "Highly Efficient Phosphorescent Emission from Organic Electroluminescent Devices," Nature, vol. 395, 151-154, (1998).

(Continued)

*Primary Examiner* — Minh D A
(74) *Attorney, Agent, or Firm* — Duane Morris LLP

(57) ABSTRACT

Embodiments may provide an extendable light source with a variable light emitting area. A first device is provided that includes a support, a first substrate movably coupled to the support, and a plurality of lighting devices disposed on the first substrate. The plurality of lighting devices includes a first portion of lighting devices and a second portion of lighting devices. The first device also includes an energizing component that is configured to selectively energize the first portion and the second portion of lighting devices based on a position of the first substrate relative to the support.

20 Claims, 8 Drawing Sheets

(56) References Cited

U.S. PATENT DOCUMENTS

| | | | |
|---|---|---|---|
| 5,844,363 | A | 12/1998 | Gu et al. |
| 6,013,982 | A | 1/2000 | Thompson et al. |
| 6,087,196 | A | 7/2000 | Sturm et al. |
| 6,091,195 | A | 7/2000 | Forrest et al. |
| 6,097,147 | A | 8/2000 | Baldo et al. |
| 6,294,398 | B1 | 9/2001 | Kim et al. |
| 6,303,238 | B1 | 10/2001 | Thompson et al. |
| 6,337,102 | B1 | 1/2002 | Forrest et al. |
| 6,468,819 | B1 | 10/2002 | Kim et al. |
| 6,528,187 | B1 | 3/2003 | Okada |
| 6,687,266 | B1 | 2/2004 | Ma et al. |
| 6,835,469 | B2 | 12/2004 | Kwong et al. |
| 6,870,196 | B2 | 3/2005 | Strip |
| 6,921,915 | B2 | 7/2005 | Takiguchi et al. |
| 7,034,470 | B2 | 4/2006 | Cok et al. |
| 7,050,835 | B2 | 5/2006 | Hack et al. |
| 7,087,321 | B2 | 8/2006 | Kwong et al. |
| 7,090,928 | B2 | 8/2006 | Thompson et al. |
| 7,154,114 | B2 | 12/2006 | Brooks et al. |
| 7,250,226 | B2 | 7/2007 | Tokito et al. |
| 7,279,704 | B2 | 10/2007 | Walters et al. |
| 7,332,232 | B2 | 2/2008 | Ma et al. |
| 7,338,722 | B2 | 3/2008 | Thompson et al. |
| 7,393,599 | B2 | 7/2008 | Thompson et al. |
| 7,396,598 | B2 | 7/2008 | Takeuchi et al. |
| 7,431,968 | B1 | 10/2008 | Shtein et al. |
| 7,445,855 | B2 | 11/2008 | Mackenzie et al. |
| 7,534,505 | B2 | 5/2009 | Lin et al. |
| 7,576,496 | B2 | 8/2009 | Duggal et al. |
| 7,639,237 | B2 | 12/2009 | Perkins |
| 7,821,479 | B2 | 10/2010 | Zhang |
| 8,247,998 | B2 * | 8/2012 | Hum et al. ................. 315/294 |
| 2002/0034656 | A1 | 3/2002 | Thompson et al. |
| 2002/0134984 | A1 | 9/2002 | Igarashi |
| 2002/0158242 | A1 | 10/2002 | Son et al. |
| 2003/0138657 | A1 | 7/2003 | Li et al. |
| 2003/0152802 | A1 | 8/2003 | Tsuboyama et al. |
| 2003/0162053 | A1 | 8/2003 | Marks et al. |
| 2003/0175553 | A1 | 9/2003 | Thompson et al. |
| 2003/0230980 | A1 | 12/2003 | Forrest et al. |
| 2004/0036077 | A1 | 2/2004 | Ise |
| 2004/0137267 | A1 | 7/2004 | Igarashi et al. |
| 2004/0137268 | A1 | 7/2004 | Igarashi et al. |
| 2004/0174116 | A1 | 9/2004 | Lu et al. |
| 2005/0025993 | A1 | 2/2005 | Thompson et al. |
| 2005/0112407 | A1 | 5/2005 | Ogasawara et al. |
| 2005/0162850 | A1 | 7/2005 | Luk et al. |
| 2005/0206325 | A1 * | 9/2005 | Wakou et al. ................. 315/224 |
| 2005/0238919 | A1 | 10/2005 | Ogasawara |
| 2005/0244673 | A1 | 11/2005 | Satoh et al. |
| 2005/0260441 | A1 | 11/2005 | Thompson et al. |
| 2005/0260449 | A1 | 11/2005 | Walters et al. |
| 2006/0008670 | A1 | 1/2006 | Lin et al. |
| 2006/0202194 | A1 | 9/2006 | Jeong et al. |
| 2006/0240279 | A1 | 10/2006 | Adamovich et al. |
| 2006/0251923 | A1 | 11/2006 | Lin et al. |
| 2006/0263635 | A1 | 11/2006 | Ise |
| 2006/0280965 | A1 | 12/2006 | Kwong et al. |
| 2007/0190359 | A1 | 8/2007 | Knowles et al. |
| 2007/0211036 | A1 | 9/2007 | Perkins |
| 2007/0278938 | A1 | 12/2007 | Yabunouchi et al. |
| 2008/0015355 | A1 | 1/2008 | Schafer et al. |
| 2008/0018221 | A1 | 1/2008 | Egen et al. |
| 2008/0106190 | A1 | 5/2008 | Yabunouchi et al. |
| 2008/0116784 | A1 * | 5/2008 | Krummacher et al. ....... 313/501 |
| 2008/0124572 | A1 | 5/2008 | Mizuki et al. |
| 2008/0220265 | A1 | 9/2008 | Xia et al. |
| 2008/0297033 | A1 | 12/2008 | Knowles et al. |
| 2009/0008605 | A1 | 1/2009 | Kawamura et al. |
| 2009/0009065 | A1 | 1/2009 | Nishimura et al. |
| 2009/0017330 | A1 | 1/2009 | Iwakuma et al. |
| 2009/0030202 | A1 | 1/2009 | Iwakuma et al. |
| 2009/0039776 | A1 | 2/2009 | Yamada et al. |
| 2009/0045730 | A1 | 2/2009 | Nishimura et al. |
| 2009/0045731 | A1 | 2/2009 | Nishimura et al. |
| 2009/0101870 | A1 | 4/2009 | Prakash et al. |
| 2009/0108737 | A1 | 4/2009 | Kwong et al. |
| 2009/0115316 | A1 | 5/2009 | Zheng et al. |
| 2009/0165846 | A1 | 7/2009 | Johannes et al. |
| 2009/0167162 | A1 | 7/2009 | Lin et al. |
| 2009/0179554 | A1 | 7/2009 | Kuma et al. |
| 2010/0067228 | A1 | 3/2010 | Hente et al. |
| 2010/0181833 | A1 * | 7/2010 | Wu ................................ 307/36 |
| 2011/0148327 | A1 * | 6/2011 | Van de Ven et al. .......... 315/312 |
| 2011/0193499 | A1 * | 8/2011 | Harbers et al. ................. 315/362 |

FOREIGN PATENT DOCUMENTS

| | | |
|---|---|---|
| EP | 2034538 | 3/2009 |
| JP | 200511610 | 1/2005 |
| JP | 2007123392 | 5/2007 |
| JP | 2007254297 | 10/2007 |
| JP | 2008074939 | 10/2009 |
| WO | WO 0139234 | 5/2001 |
| WO | WO 0202714 | 1/2002 |
| WO | WO 0215645 | 2/2002 |
| WO | WO 03040257 | 5/2003 |
| WO | WO 03060956 | 7/2003 |
| WO | WO 2004093207 | 10/2004 |
| WO | WO 2004107822 | 12/2004 |
| WO | WO 2005014551 | 2/2005 |
| WO | WO 2005019373 | 3/2005 |
| WO | WO 2005030900 | 4/2005 |
| WO | WO 2005089025 | 9/2005 |
| WO | WO 2005123873 | 12/2005 |
| WO | WO 2006009024 | 1/2006 |
| WO | WO 2006056418 | 6/2006 |
| WO | WO 2006072002 | 7/2006 |
| WO | WO 2006082742 | 8/2006 |
| WO | WO 2006098120 | 9/2006 |
| WO | WO 2006100298 | 9/2006 |
| WO | WO 2006103874 | 10/2006 |
| WO | WO 2006114966 | 11/2006 |
| WO | WO 2006132173 | 12/2006 |
| WO | WO 2007002683 | 1/2007 |
| WO | WO 2007004380 | 1/2007 |
| WO | WO 2007063754 | 6/2007 |
| WO | WO 2007063796 | 6/2007 |
| WO | WO 2008101842 | 8/2008 |
| WO | WO 2008132085 | 11/2008 |
| WO | WO 2009000673 | 12/2008 |
| WO | WO 2009003898 | 1/2009 |
| WO | WO 2009008311 | 1/2009 |
| WO | WO 2009018009 | 2/2009 |
| WO | WO 2009050290 | 4/2009 |
| WO | WO 2008056746 | 5/2009 |
| WO | WO 2009021126 | 5/2009 |
| WO | WO 2009062578 | 5/2009 |
| WO | WO 2009063833 | 5/2009 |
| WO | WO 2009066778 | 5/2009 |
| WO | WO 2009066779 | 5/2009 |
| WO | WO 2009086028 | 7/2009 |
| WO | WO 2009100991 | 8/2009 |
| WO | WO 2009/136305 | 11/2009 |
| WO | WO 2009/146907 | 12/2009 |
| WO | WO 2010/115183 | 10/2010 |

OTHER PUBLICATIONS

Baldo et al., "Very high-efficiency green organic light-emitting devices based on electrophosphorescence," Appl. Phys. Lett., vol. 75, No. 3, 4-6 (1999).

Kuwabara, Yoshiyuki et al., "Thermally Stable Multilayered Organic Electroluminescent Devices Using Novel Starburst Molecules, 4,4',4"-Tri(N-carbazolyl)triphenylamine (TCTA) and 4,4',4"-Tris(3-methylphenylphenyl-amino)triphenylamine (m-MTDATA), as Hole-Transport Materials," Adv. Mater., 6(9):677-679 (1994).

Paulose, Betty Marie Jennifer S. et al., "First Examples of Alkenyl Pyridines as Organic Ligands for Phosphorescent Iridium Complexes," Adv. Mater., 16(22):2003-2007 (2004).

Tung, Yung-Liang et al., "Organic Light-Emitting Diodes Based on Charge-Neutral $Ru^{II}$ PHosphorescent Emitters," Adv. Mater., 17(8):1059-1064 (2005).

(56) References Cited

OTHER PUBLICATIONS

Huang, Jinsong et al., "Highly Efficient Red-Emission Polymer Phosphorescent Light-Emitting Diodes Based on Two Novel Tris(1-phenylisoquinolinato-C2,N)iridium(III) Derivatives," *Adv. Mater.*, 19:739-743 (2007).
Wong, Wai-Yeung, "Multifunctional Iridium Complexes Based on Carbazole Modules as Highly Efficient Electrophosphors," *Angew. Chem. Int. Ed.*, 45:7800-7803 (2006).
Tang, C.W. And VanSlyke, S.A., "Organic Electroluminescent Diodes," *Appl. Phys. Lett.*, 51(12):913-915 (1987).
Adachi, Chihaya et al., "Organic Electroluminescent Device Having a Hole Conductor as an Emitting Layer," *Appl. Phys. Lett.*, 55(15):1489-1491 (1989).
Ma, Yuguang et al., "Triplet Luminescent Dinuclear-Gold(/) Complex-Based Light-Emitting Diodes with Low Turn-On voltage," *Appl. Phys. Lett.*, 74(10):1361-1363 (1999).
Gao, Zhiqiang et al., "Bright-Blue Electroluminescence From a Silyl-Substituted ter-(phenylene-vinylene) derivative," *Appl. Phys. Lett.*, 74(6):865-867 (1999).
Lee, Chang-Lyoul et al., "Polymer Phosphorescent Light-Emitting Devices Doped with Tris(2-phenylpyridine) Iridium as a Triplet Emitter," *Appl. Phys. Lett.*, 77(15):2280-2282 (2000).
Hung, L.S. et al., "Anode Modification in Organic Light-Emitting Diodes by Low-Frequency Plasma Polymerization of $CHF_3$," *Appl. Phys. Lett.*, 78(5):673-675 (2001).
Ikai, Masamichi and Tokito, Shizuo, "Highly Efficient Phosphorescence From Organic Light-Emitting Devices with an Exciton-Block Layer," *Appl. Phys. Lett.*, 79(2):156-158 (2001).
Wang, Y. et al., "Highly Efficient Electroluminescent Materials Based on Fluorinated Organometallic Iridium Compounds," *Appl. Phys. Lett.*, 79(4):449-451 (2001).
Kwong, Raymond C. et al., "High Operational Stability of Electrophosphorescent Devices," *Appl. Phys. Lett.*, 81(1):162-164 (2002).
Holmes, R.J. et al., "Blue Organic Electrophosphorescence Using Exothermic Host-Guest Energy Transfer," *Appl. Phys. Lett.*, 82(15):2422-2424 (2003).
Sotoyama, Wataru et al., "Efficient Organic LIght-Emitting Diodes with Phosphorescent Platinum Complexes Containing NΛCΛN-Coordinating Tridentate Ligand," *Appl. Phys. Lett.*, 86:153505-1-153505-3 (2005).
Okumoto, Kenji et al., "Green Fluorescent Organic Light-Emitting Device with External Quantum Efficiency of Nearly 10%," *Appl. Phys. Lett.*, 89:063504-1-063504-3 (2006).
Kanno, Hiroshi et al., "Highly Efficient and Stable Red Phosphorescent Organic Light-Emitting Device Using bis[2-(2-benzothiazoyl)phenolato]zinc(II) as host material," *Appl. Phys. Lett.*, 90:123509-1-123509-3 (2007).
Aonuma, Masaki et al., "Material Design of Hole Transport Materials Capable of Thick-Film Formation in Organic Light Emitting Diodes," *Appl. Phys. Lett.*, 90:183503-1-183503-3 (2007).
Sun, Yiru and Forrest, Stephen R., "High-Efficiency White Organic Light Emitting Devices with Three Separate Phosphorescent Emission Layers," *Appl. Phys. Lett.*, 91:263503-1-263503-3 (2007).
Adachi, Chihaya et al., "High-Efficiency Red Electrophosphorescence Devices," *Appl. Phys. Lett.*, 78(11):1622-1624 (2001).
Wong, Keith Man-Chung et al., A Novel Class of Phosphorescent Gold(III) Alkynyl-Based Organic Light-Emitting Devices with Tunable Colour, *Chem. Commun.*, 2906-2908 (2005).
Hamada, Yuji et al., "High Luminance in Organic Electroluminescent Devices with Bis(10- hydroxybenzo[h]quinolinato)beryllium as an Emitter," *Chem. Lett.*, 905-906 (1993).

Nishida, Jun-ichi et al., "Preparation, Characterization, and Electroluminescence Characteristics of α-Diimine-type Platinum(II) Complexes with Perfluorinated Phenyl Groups as Ligands," *Chem. Lett.*, 34(4):592-593 (2005).
Mi, Bao-Xiu et al., "Thermally Stable Hole-Transporting Material for Organic Light-Emitting Diode: an Isoindole Derivative," *Chem. Mater.*, 15(16):3148-3151 (2003).
Huang, Wei-Sheng et al., "Highly Phosphorescent Bis-Cyclometalated Iridium Complexes Containing Benzoimidazole-Based Ligands," *Chem. Mater.*, 16(12):2480-2488 (2004).
Niu, Yu-Hua et al., "Highly Efficient Electrophosphorescent Devices with Saturated Red Emission from a Neutral Osmium Complex," *Chem. Mater.*, 17(13):3532-3536 (2005).
Lo, Shih-Chun et al., "Blue Phosphorescence from Iridium(III) Complexes at Room Temperature," *Chem. Mater.*, 18(21):5119-5129 (2006).
Takizawa, Shin-ya et al., "Phosphorescent Iridium Complexes Based on 2-Phenylimidazo[1,2-α]pyridine Ligands: Tuning of Emission Color toward the Blue Region and Application to Polymer Light-Emitting Devices," *Inorg. Chem.*, 46(10):4308-4319 (2007).
Lamansky, Sergey et al., "Synthesis and Characterization of Phosphorescent Cyclometalated Iridium Complexes," *Inorg. Chem.*, 40(7):1704-1711 (2001).
Ranjan, Sudhir et al., "Realizing Green Phosphorescent Light-Emitting Materials from Rhenium(I) Pyrazolato Diimine Complexes," *Inorg. Chem.*, 42(4):1248-1255 (2003).
Noda, Tetsuya and Shirota,Yasuhiko, "5,5'-Bis(dimesitylboryl)-2,2'-bithiophene and 5,5"-Bis(dimesitylboryl)-2,2':5',2"-terthiophene as a Novel Family of Electron-Transporting Amorphous Molecular Materials," *J. Am. Chem. Soc.*, 120 (37):9714-9715 (1998).
Sakamoto,Youichi et al., "Synthesis, Characterization, and Electron-Transport Property of Perfluorinated Phenylene Dendrimers," *J. Am. Chem. Soc.*, 122(8):1832-1833 (2000).
Adachi, Chihaya et al., "Nearly 100% Internal Phosphorescence Efficiency in an Organic Light Emitting Device," *J. Appl. Phys.*, 90(10):5048-5051 (2001).
Shirota, Yasuhiko et al., "Starburst Molecules Based on π-Electron Systems as Materials for Organic Electroluminescent Devices," *Journal of Luminescence*, 72-74:985-991 (1997).
Inada, Hiroshi and Shirota, Yasuhiko, "1,3,5-Tris[4-(diphenylamino)phenyl]benzene and its Methylsubstituted Derivatives as a Novel Class of Amorphous Molecular Materials," *J. Mater. Chem.*, 3(3):319-320 (1993).
Kido, Junji et al., 1,2,4-Triazole Derivative as an Electron Transport Layer in Organic Electroluminescent Devices, *Jpn. J. Appl. Phys.*, 32:L917-L920 (1993).
Van Slyke, S. A. et al., "Organic Electroluminescent Devices with Improved Stability," *Appl. Phys. Lett.*, 69(15 ):2160-2162 (1996).
Guo, Tzung-Fang et al., "Highly Efficient Electrophosphorescent Polymer Light-Emitting Devices," *Organic Electronics*, 1:15-20 (2000).
Palilis, Leonidas C., "High Efficiency Molecular Organic Light-Emitting Diodes Based on Silole Derivatives and Their Exciplexes," *Organic Electronics*, 4:113-121 (2003).
Ikeda, Hisao et al., "P-185: Low-Drive-Voltage OLEDs with a Buffer Layer Having Molybdenum Oxide," *SID Symposium Digest*, 37:923-926 (2006).
T. Östergård et al., "Langmuir-Blodgett Light-Emitting Diodes of Poly(3-Hexylthiophene): Electro-Optical Characteristics Related to Structure," *Synthetic Metals*, 87:171-177 (1997).
Hu, Nan-Xing et al., "Novel High $T_g$ Hole-Transport Molecules Based on Indolo[3,2-*b*]carbazoles for Organic Light-Emitting Devices," *Synthetic Metals*, 111-112:421-424 (2000).
Salbeck, J. et al., "Low Molecular Organic Glasses for Blue Electroluminescence," *Synthetic Metals*, 91:209-215 (1997).

\* cited by examiner

EXTENDABLE LIGHT SOURCE WITH VARIABLE LIGHT EMITTING AREA

BACKGROUND OF THE INVENTION

PARTIES TO A JOINT RESEARCH AGREEMENT

The claimed invention was made by, on behalf of, and/or in connection with one or more of the following parties to a joint university corporation research agreement: Regents of the University of Michigan, Princeton University, University of Southern California, and the Universal Display Corporation. The agreement was in effect on and before the date the claimed invention was made, and the claimed invention was made as a result of activities undertaken within the scope of the agreement.

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris (2-phenylpyridine) iridium, denoted Ir(ppy)$_3$, which has the structure of Formula I:

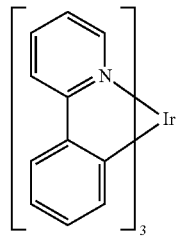

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OF THE INVENTION

Embodiments may provide an extendable light source with a variable light emitting area. A first device is provided that includes a support, a first substrate movably coupled to the support, and a plurality of lighting devices disposed on the first substrate. The plurality of lighting devices includes a first portion of lighting devices and a second portion of lighting devices. The first device also includes an energizing component that is configured to selectively energize the first portion and the second portion of lighting devices based on a position of the first substrate relative to the support.

In some embodiments, in the first device as describe above, the first portion and the second portion of the plurality of lighting devices are switchably connected in parallel with each other. In some embodiments, in the first device as described above, the first portion and the second portion of the plurality of lighting devices are switchably connected in series with each other. In some embodiments, in the first device as described above, at least one of the first portion or the second portion of lighting devices comprises a single lighting device.

In some embodiments, in the first device as described above, the first portion of the plurality of lighting devices includes a plurality of lighting devices electrically connected in a first series and the second portion of the plurality of lighting devices includes a plurality of lighting devices electrically connected in a second series. The first and the second series are switchably connected in parallel with each other.

In some embodiments, in the first device as described above, the plurality of lighting devices further includes a third portion of lighting devices. The energizing component is further configured to selectively energize the first portion, the second portion, and the third portion of lighting devices based on a position of the substrate relative to the support.

In some embodiments, in the first device as described above, the plurality of lighting devices includes a plurality of organic light emitting devices (OLEDs), and wherein each of the plurality of OLEDs has a first electrode, a second electrode disposed over the first electrode, and an organic electroluminescent (EL) material disposed between the first and the second electrodes. In some embodiments, the first electrode, the second electrode, or the organic EL material of each the plurality of OLEDs is patterned. In some embodiments, the first electrode of each of the plurality of OLEDs is patterned and the second electrode of each of the plurality of OLEDs is common. In some embodiments, the first electrode and the second electrode of each of the plurality of OLEDs is patterned.

In some embodiments, in the first device as described above, the plurality of lighting devices comprises a plurality of LEDs.

In some embodiments, in the first device as described above, the support includes a housing that is configured to selectively contain or expose the first and second portions of lighting devices disposed on the first substrate. In some embodiments, the energizing component is configured to energize the first portion of lighting devices when the first portion of lighting devices is not contained within the housing and to not energize the first portion of lighting devices when the first portion of lighting devices is contained within the housing. The energizing component may also be configured to energize the second portion of lighting devices when the second portion of lighting devices is not contained within the housing and to not energize the second portion of lighting devices when the second portion of lighting devices is contained within the housing. In some embodiments, the housing may include one or more portions of OLEDs configured to replace another portion of OLEDs. Preferably, a section of the substrate on which the portion of OLEDs to be replaced is disposed on may be cut, torn or otherwise removed (or separated) from the substrate.

In some embodiments, in the first device as described above, a first, a second, and a third position are defined for the first substrate. The energizing component is configured to energize neither the first portion nor the second portion of lighting devices when the first substrate is in the first position, to energize the first portion but not the second portion of lighting devices when the first substrate is in the second position, and to energize both the first portion and the second portion of lighting devices when the first substrate is in the third position. In some embodiments, the support includes a rod, and the first portion and the second portion of the plurality of lighting devices substantially wrap around the rod when the first substrate is in the first position. When the substrate is in the second position, the second portion but not the first portion of the plurality of lighting devices substantially wrap around the rod. When the first substrate is in the third position, both the first portion and the second portion of the plurality of lighting devices do not substantially wrap around the rod. In some embodiments, the rod includes a power source, which may comprise a battery. In some embodiments, the rod includes the energizing component.

In some embodiments, in the first device as described above, where the energizing component is configured to energize neither the first portion nor the second portion of lighting devices when the first substrate is in the first position, to energize the first portion but not the second portion of lighting devices when the first substrate is in the second position, and to energize both the first portion and the second portion of lighting devices when the first substrate is in the third position, the support includes a housing that is configured to selectively contain some or all of the first substrate. In the first position, the first portion and the second portion of the plurality of lighting devices are substantially contained within the housing. In the second position, the second portion but not the first portion of the plurality of lighting devices is substantially contained within the housing. In the third position, both the first portion and the second portion of the plurality of lighting devices are not substantially contained in the housing. In some embodiments, the housing has a shape that is substantially cylindrical or rectangular. In some embodiments, the support further includes a rod and portions of the first substrate may substantially wrap around the rod when the portions of the first substrate are contained within the housing. In some embodiments, the rod is contained substantially within the housing.

In some embodiments, in the first device as described above, where the energizing component is configured to energize neither the first portion nor the second portion of lighting devices when the first substrate is in the first position, to energize the first portion but not the second portion of lighting devices when the first substrate is in the second position, and to energize both the first portion and the second portion of lighting devices when the first substrate is in the third position, the energizing component includes a first contact electrically connected to the first portion of lighting devices, a second contact electrically connected to the second portion of lighting devices, and a third contact electrically connected to at least one of a voltage source or a current source. The third contact does not electrically connect to either the first or the second contact when the first substrate is in the first position. The third contact electrically connects to the first contact but not the second contact when the first substrate is in the second position. The third contact electrically connects to the first contact and the second contact when the first substrate is in the third position. In some embodiments, the third contact comprises an electrical conductor that extends in a direction that is substantially parallel to the direction that the substrate moves when going from the first position to the second or the third position. In some embodiments, the third contact comprises a plurality of switches, where each switch is selectively connected to a voltage source, a current source, or a plurality of lighting devices. In some embodiments, each switch selectively connects a plurality of lighting devices to at least one of a voltage source or a current source. In some embodiments, the plurality of switches comprises a first switch that selectively connects the first contact to at least one of a voltage source or a current source when activated, and a second switch that selectively connects the second contact to a voltage source or a current source when activated. When the first substrate is in the first position, the first switch and the second switch are not activated. When the first substrate is in the second position, the first switch is activated and the second switch is not activated. When the first substrate is in the third position, the first switch and the second switch are activated. In some embodiments, the first switch and the second switch are mechanical or electronic switches or circuits. In some embodiments, the support comprises a housing configured to selectively contain some or all of the first substrate that includes an opening for receiving some or all of the substrate. The first and the second switches are activated by at least one of a physical protrusion, a capacitance switch, or a proximity switch located at or near the opening of the housing.

In some embodiments, in the first device as described above, the energizing component comprises a driving unit. The driving unit includes a sensing module configured to determine the position of the first substrate, a control module configured to determine which of the plurality of lighting devices to supply current to based on the position of the first substrate, a power supply, and one or more lighting device drivers that are electrically connected to the plurality of lighting devices. The lighting device drivers may be configured to control the brightness of the plurality of the lighting devices. In some embodiments, the one or more lighting device drivers control the brightness of the plurality of lighting devices by controlling at least one of the current or the voltage that is supplied to each of the lighting devices. In some embodiments, the energizing component further includes a regulator module configured to determine the amount of power and voltage to apply to the plurality of lighting devices In some embodiments, in the first device as described above, the first substrate is flexible. In some embodiments, the first substrate comprises a plastic foil or metal foil. In some embodiments, where the first substrate comprises metal foil, the plurality of lighting sources comprises top emission OLEDs.

In some embodiments, in the first device as described above, the first substrate is rigid. In some embodiments, in the first device as described above, the lighting devices emit substantially white light. In some embodiments, the first device as described above comprises a task lamp or a novelty lamp.

Embodiments may also provide a device that includes a support and a first substrate movably coupled to the support. A plurality of portions of lighting devices are disposed on the first substrate, wherein each portion comprises one or more lighting devices. The device also includes an energizing component that is configured to selectively energize each of the portions of lighting devices based on a position of the first substrate relative to the support.

In some embodiments, in the device as described above, the support comprises a housing configured to selectively contain the portions of the substrate that comprise the plurality of portions of lighting devices. The energizing component is configured to energize the portions of lighting devices that are not contained with the housing and to not energize the portions of the lighting devices that are contained within the housing.

In some embodiments, in the first device as described above, the support includes a rod. The portions of the first substrate comprising the plurality of portions of lighting devices are configured to selectively wrap around the rod. The energizing component is configured to energize the portions of lighting devices that are not substantially wrapped around the rod and to not energize the portions of the lighting devices that are substantially wrapped around the rod.

Embodiments may provide a large area illumination source that can be partially extracted or withdrawn from a housing (or, otherwise move from a stored position to a position for use, such as rolling and unrolling a flexible light emitting area), where only the portion of the large area illumination source that is withdrawn from the housing emits light. That is, for instance, the device may comprise a light emitting area that extends and retracts into a housing (or other stored or not-in-use position), wherein only the light emitting area extended from the housing (i.e. the portion that desired to be used) emits light. This may provide a more energy efficient device in comparison to devices that energy the entire light emitting area, regardless of whether each portion is extended out of the housing (or otherwise designated for use). Moreover, some embodiments may also provide for illumination sources that maintain a constant brightness over the extendable emissive area, even as the area increases or decreases (e.g. as a substrate comprising lighting devices is further extracted from a housing or otherwise moved relative to a fixed support).

DETAILED DESCRIPTION OF THE INVENTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
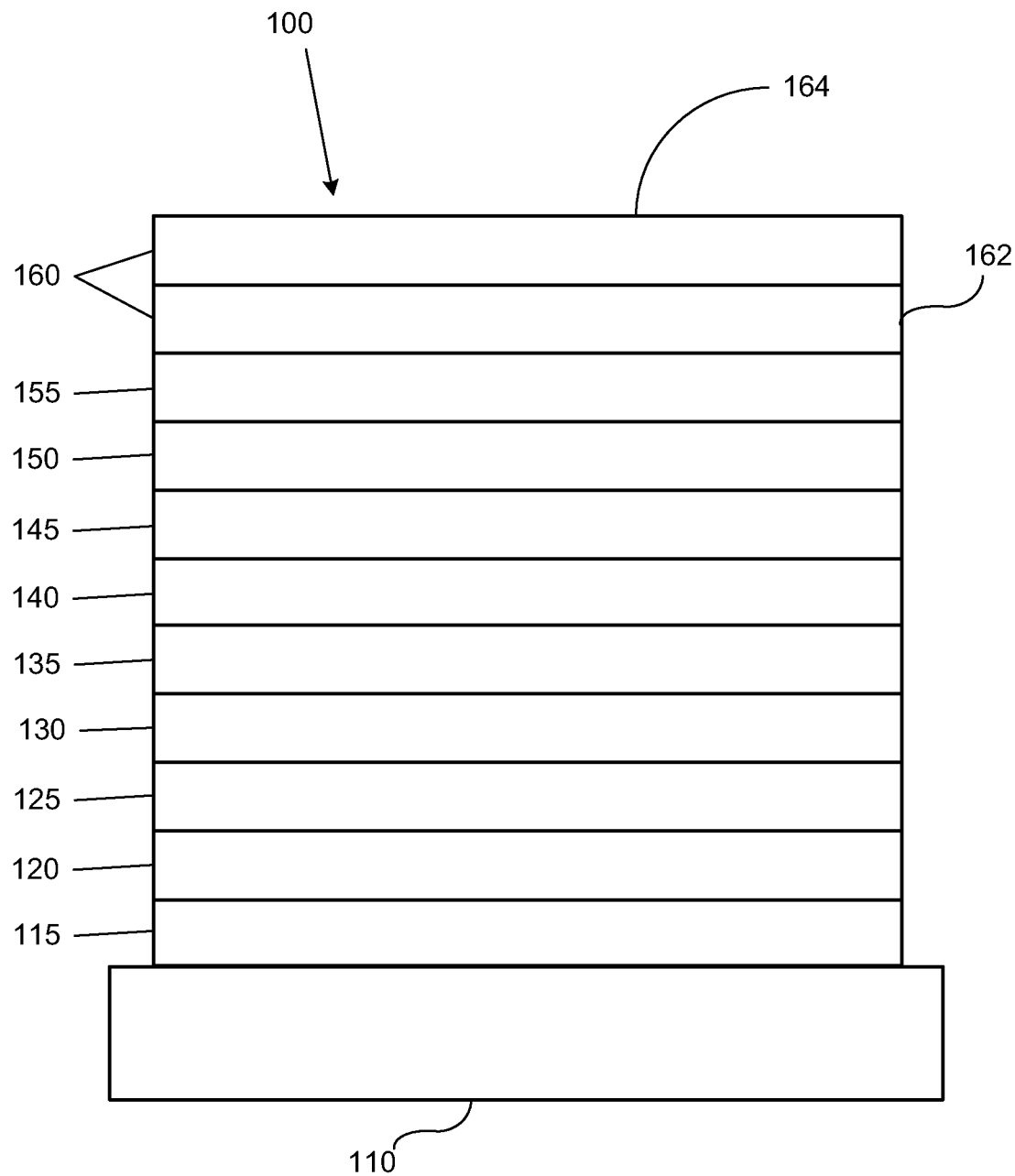
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with F.sub.4-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
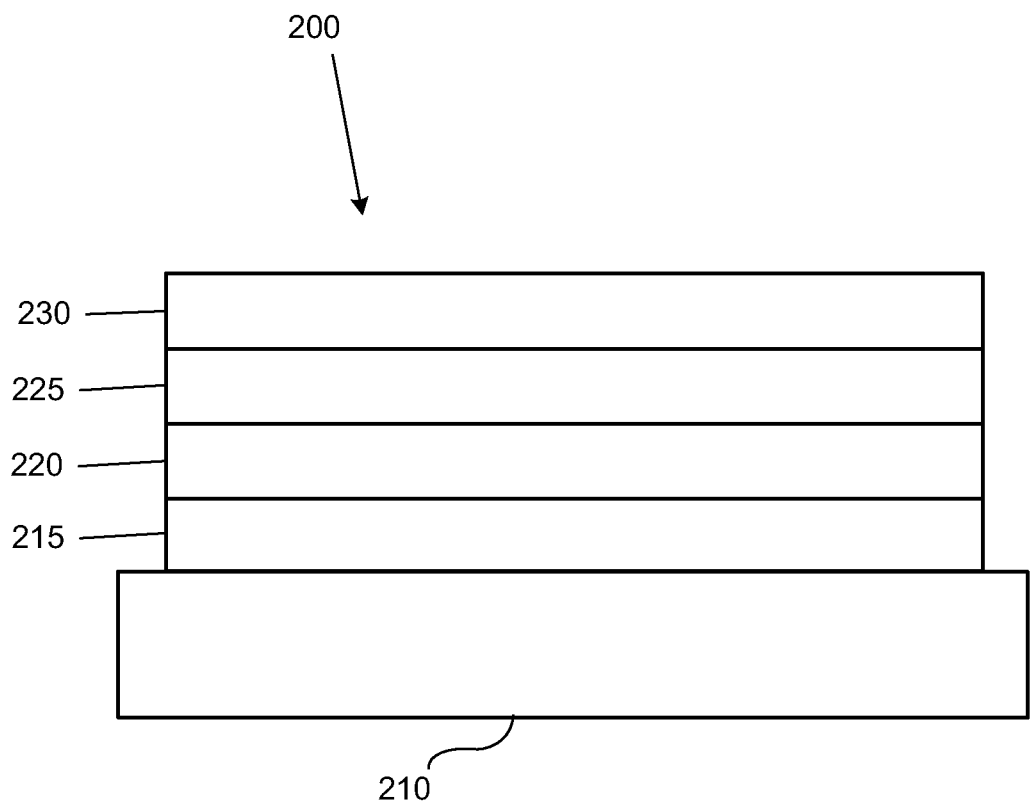
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, lighting fixtures, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Additional definitions for terms as used in this application are provided as follows:

As used herein, a "support" may refer to an apparatus or a component thereof to which a substrate (or a portion thereof) may be coupled to (e.g. attached, adhered to, disposed on, or otherwise connected). A support may include any apparatus, device, or component that may contain some or all of the substrate at a given time (e.g. a housing) such as a box or a cylinder. A support may include a component for which the substrate (or a portion thereof) is attached to or otherwise coupled (for instance, a support may comprise a component such as a rod to which the substrate is wrapped completely or partially around). A support may comprise any suitable shape and material. Examples of supports are described with reference to the exemplary embodiments of FIGS. 3 and 4.

As used herein, the term "movably coupled" may refer to a configuration wherein a first component (such as a substrate) has at least a portion that is coupled to at least a part of a second component (such as a support), but where at least part of the second component may remain in a fixed position as the first component is moved into a different position. The term "fixed" may refer to a configuration in which the relative geometric position of at least a portion of the second component (e.g. a support), remains in the same position as the first component (e.g. a substrate) or a portion thereof is moved. That is, for instance, the distance between a point on the support and a point on at least a portion of the substrate is increased or decreased as the substrate is moved or extended. However, in some embodiments, the second component or a portion thereof may move, for example, rotationally (e.g. when a support comprises a rod and bearings) or may have a portion that moves (e.g. extends) with the first portion (e.g. a portion of the support may slide with the substrate). For instance, "movably coupled" may comprise a first component that is wrapped around a second component, wherein the first component has portions that may be unwrapped such that those portions may be moved away from the point at which the first component and the second component are coupled. "Movably coupled" may also comprise a configuration wherein a portion of the second component that is coupled to the first component moves along with the first component, but both the first component (or a portion thereof) and a second component move in relation to another portion of the first component.

As used herein, a "lighting device" may refer to a device that has an emissive layer that comprises an organic emitting material or materials (such as an organic light emitting diode (OLED)) or an inorganic emitting material or materials (such as a light emitting diode (LED)). A single substrate may comprise a single lighting device or a plurality of lighting devices.

As used herein, an "energizing component" may comprise any device or component that may selectively provide current or voltage to a lighting device or devices such that light is emitted. For instance, an energizing component may comprise a switch, a plurality of switches, control hardware, control software, sensors, device drivers, etc. The energizing component may in some embodiments also comprise a power source (such as a voltage source or a current source) including, for instance, a battery.

As used herein, "selectively energizing" may refer to providing current or voltage to some lighting devices such that light is emitted, but not necessarily providing voltage or current to other lighting devices. That is, for example, in some instances a portion of lighting devices may be energized, while other portions of lighting devices may not be energized. However, in some instances (for example, in some embodiments if all of the lighting devices are disposed outside of a housing), all of the lighting devices may be energized without affecting whether the energizing is selective.

The ability to make efficient large area organic light emitters on flexible substrates has led to designs for new applications of lighting, such as, by way of example, multi-functional windows or light emitting "roller-blinds." Such devices may utilize a flexible OLED device (e.g. a device comprising one or more OLEDs disposed on a flexible substrate) in a configuration where the OLED device may be retracted in some manner (such as, for instance, being "rolled" into a compact container similar to a window blind). In this regard, U.S. Pat. No. 7,050,835 to Hack et. al, which is hereby incorporated by reference in its entirety, discloses an exemplary device wherein the display is rolled into a baton-like container. Such devices are often inefficient in that they may require that the entire display (i.e. the light emitting area that comprises the portion of the substrate on which the lighting devices are disposed on) be extracted or otherwise exposed (such as when the substrate is unrolled in the exemplary "window roller blinds" discussed above) prior to using the device. This may limit the applications of such devices, and/or make the devices less than desirable for some uses, particularly energy efficient lighting where it may be desirable to energize only the unrolled portion of the substrate. Similar exemplary devices that may comprise one or more of these deficiencies are shown in WO/2009136305A1, U.S. Pat. No. 7,639,237, WO2009/146917A2, and U.S. Pat. Pub. No. 2010/0067228, each of which is hereby incorporated by reference in their entireties.

Such devices generally energize portions of a light emitting area (i.e. the area of the substrate that comprises the plurality of lighting devices) that are not desired to be in use, such as those portions that have yet to be extracted or exposed from a housing (e.g. portions of the substrate that are still "rolled up"). As used herein, a portion of the substrate is "rolled up" if the portion of the substrate substantially overlaps and/or is disposed over another portion of the substrate. Such devices may thereby be inefficient with regards to power consumption and may have shorter lifetimes because these devices energize portions of the light emitting area that are not desired to be in use. Moreover, energizing portions of the device that are disposed within a housing may create issues with regard to heating of the device (for instance, because the heat may not be readily dissipated from within such an enclosed, or partially enclosed, environment), which could further degrade the device and reduce lifetime, or require that additional cooling and/or heat extraction components be included in the device (adding expense and costs).

Moreover, similar devices, such as those that comprise LEDs, rigid substrates, housings of any suitable size or shape, no housing at all, and/or various support structures may also suffer from some or all of these deficiencies. Presently, such devices do not provide for selectively energizing a portion of the device based on the position of the light emitting area (such as whether the light emitting area is enclosed within a housing or is extended for use).

Embodiments disclosed herein may provide an efficient and/or adaptable device having a light emitting area (e.g. a portion of a substrate having a plurality of lighting devices disposed thereon), where portions of the light emitting area may be selectively energized based on the position of the light emitting area (e.g. a position of a movable substrate relative to a fixed support of the device). That is, for instance, in some embodiments an extendable illumination device is provided that may have a portion that expands and then retracts into and out of a housing (or simply relative to a fixed support), and in the process, only the portions of the light emitting area that are located outside of the housing are energized so as to emit light (or, in embodiments that do not comprise a housing, then the portions of the light emitting area that are extended so as to be in a position of intended use are energized). In this manner, embodiments may have reduced power consumption in comparison to devices that energize the entire light emitting area, regardless of whether a particular portion is located within a housing (or otherwise in a position to be intended for use). Embodiments may also thereby provide the ability to use only a portion of the light emitting area of the device (i.e., embodiments may not require that the entire device be unrolled, extended, removed from a housing, etc. prior to use), potentially providing increased flexibility and adaptability of use of the device for different purposes.

As noted above, in some embodiments, the device may include a plurality of OLEDs or other light emitting devices disposed on a substrate, where the substrate may be selectively disposed in a housing. The substrate can be reversibly pulled out of the housing to produce a variable area of a light emitting surface. In some embodiments, the device is designed to be used as an illumination source and may emit white light. However, embodiments are not so limited, and thereby some embodiments may emit light having any suitable color.

In some embodiments, it may be preferred that the device comprises a substrate in the shape of a cylinder (for instance, the substrate may comprise a roll in a configuration similar to a window roller-blind) having a plurality of OLEDs disposed thereon (i.e. a "rolled OLED lamp"). As noted above, a rolled OLED lamp (whether disposed within a housing or not) that provides a variable amount of light depending on the amount of the substrate that is "pulled out" of the roll may potentially reduce energy consumption and reduce device degradation in relation to devices that simply energize the entire light emitting area (i.e. the entire "roll" or substrate) even when only a portion thereof is in a position to be used (i.e. is unrolled). In some embodiments, this selective energizing of the organic devices located on the substrate of the rolled OLED lamp could be accomplished by configuring the device as a display, with all of the associated addressing hardware (e.g. AMOLED design, with individually addressable pixels), and sending the appropriate white image to the display depending on how much of the substrate is extended (i.e. unrolled). That is, for instance, an "image" that renders a portion of the lighting devices disposed on the substrate as "white" (or energizes those devices) when the device is partially unrolled could be used. Generally, however, there is no need to display an image on a lamp and embodiments may thereby provide a simpler and less expensive way to accomplish this attribute, some example of which are disclosed herein with reference to the exemplary embodiments shown in FIGS. 5-7. Although described above with reference to a "rolled OLED lamp" embodiments are not so limited, and the devices disclosed in FIGS. 5-7 may be used in any suitable extendable light source device.

Figure 5:
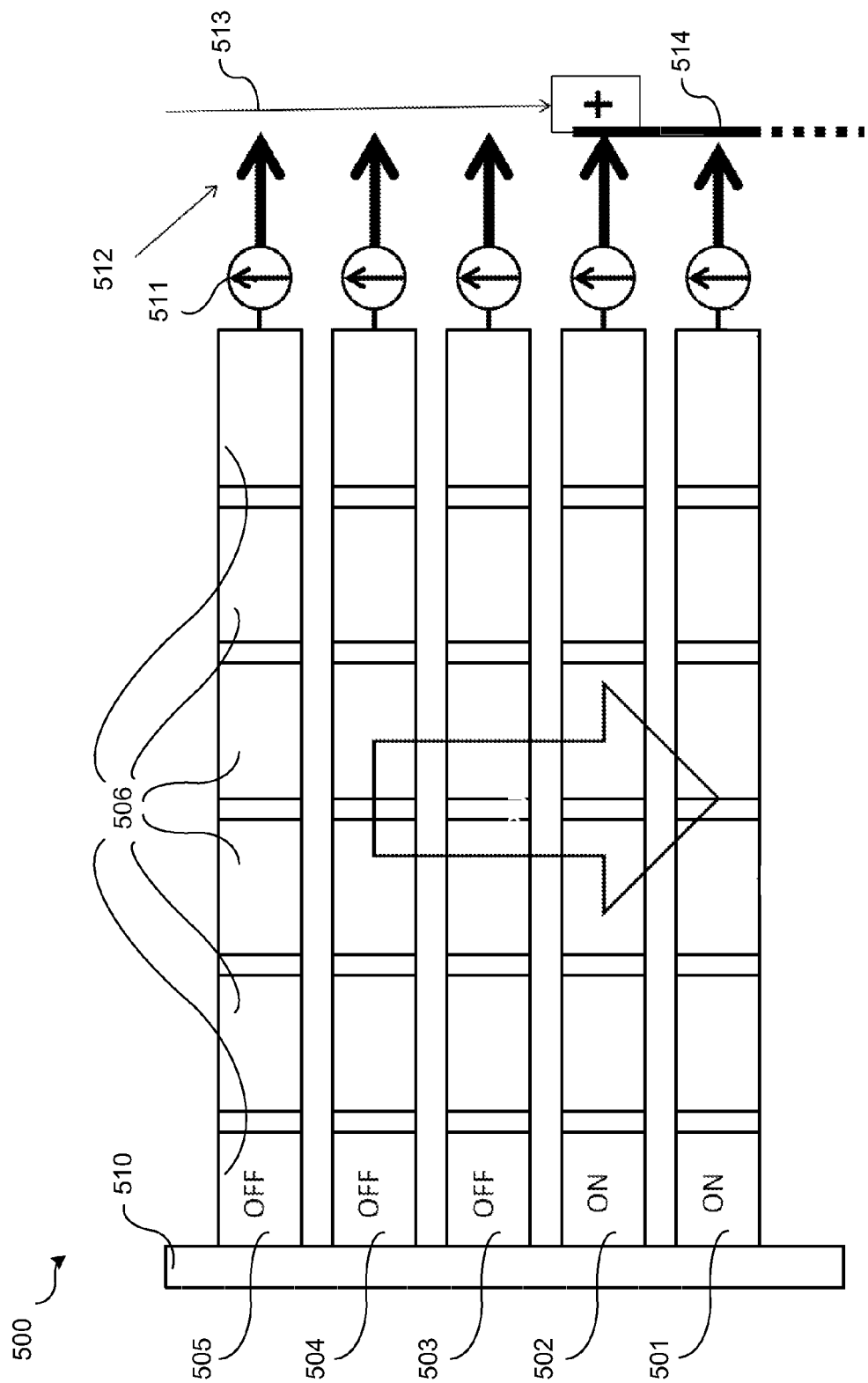
FIG. 5 shows an exemplary device according to some embodiments comprising a plurality of portions of OLEDs switchably connected in parallel.
Figure 6:
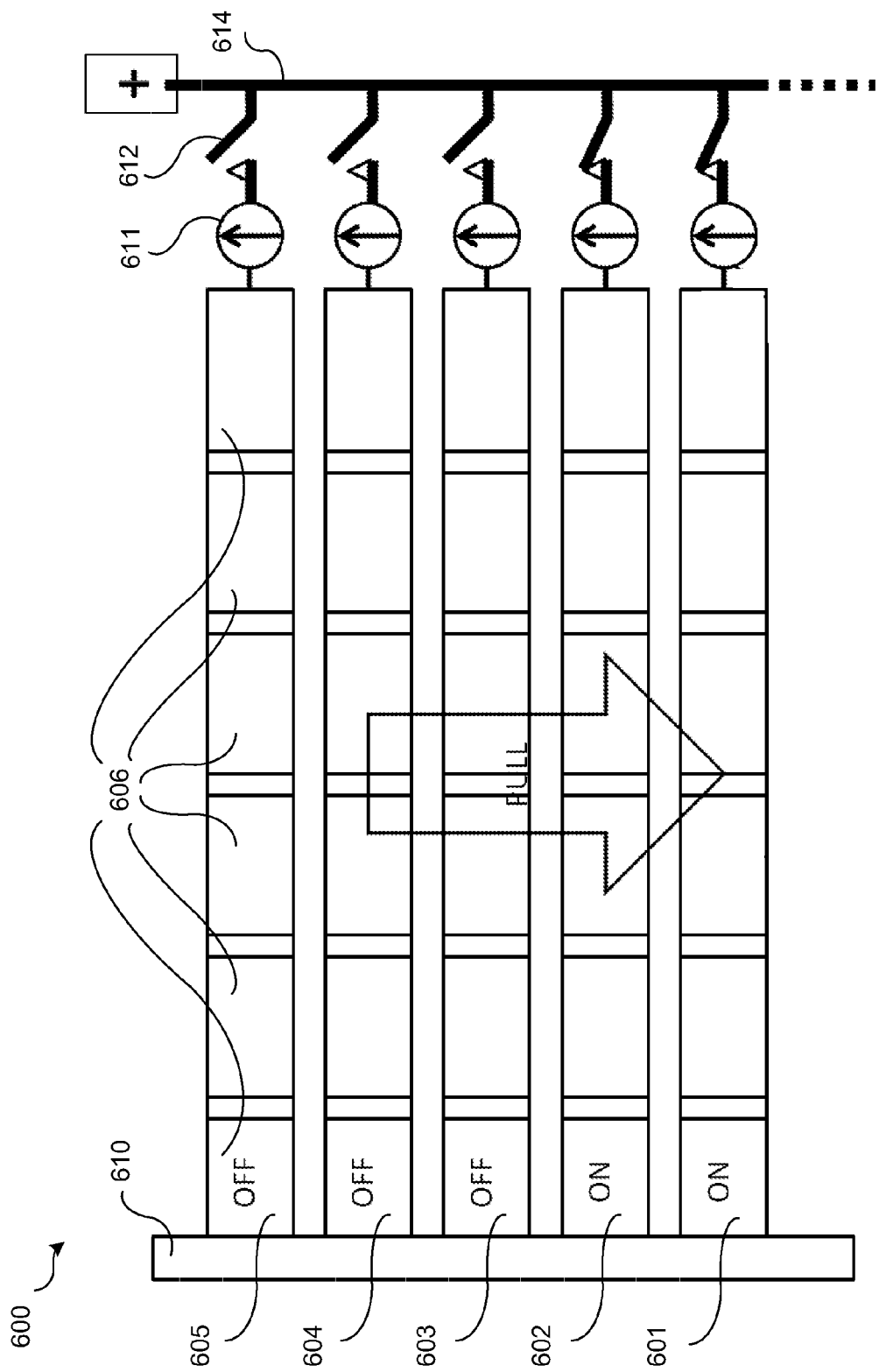
FIG. 6 shows an exemplary device according to some embodiments comprising a plurality of portions of OLEDs switchably connected in parallel.

In some embodiments, it may be preferred that the first device operates at constant brightness as the light emitting area is extracted from the housing or is otherwise moved in relation to a support. However, if the same current is applied to an increasing light emitting area (e.g. to an increasing number of active OLEDs), then the brightness of the device will decrease as more of the light emitting area is moved into an active position (e.g. outside of a housing), even though the total lumen output may remain approximately constant (ignoring nonlinearities in the light emitting phosphors, etc.) In this regard, in some embodiments, it is thereby preferable that a variable quantity of light may be provided that depends, at least in part, on the amount of the light emitting area that is moved away from a fixed support (e.g. pulled out of a housing) so as to maintain a relatively constant brightness of the device. That is, for instance, in some embodiments, as a larger portion of the light emitting area is energized (e.g. as more lighting devices disposed on a substrate are energized), the amount of current supplied to the light emitting area is also increased such that the brightness (and current density) of the device remains relatively constant (although the total luminance of the device may increase). In this manner, embodiments may maintain a constant current density through the illuminated area of the lamp as the portions of the light emitting area are moved toward and/or away from a fixed support (e.g. pulled in and out of the housing). In some embodiments, it may be preferred that the increase in current is proportional to the increase in the energized light emitting area. Examples of embodiments that may provide for relatively constant brightness as the energized light emitting area changes are shown in FIGS. 5 and 6, and will be described in detail below.

However, in contrast to the above, in some embodiments it may be preferred that the amount of light that is provided by the device remains relatively constant (and thus the brightness may decrease as the energized light emitting area is increased) and thereby approximately the same current may be supplied to the active light emitting area, regardless of increases and decreases in the area (i.e. the number of energized light devices) related to the movement of the substrate of the device.

Figure 8:
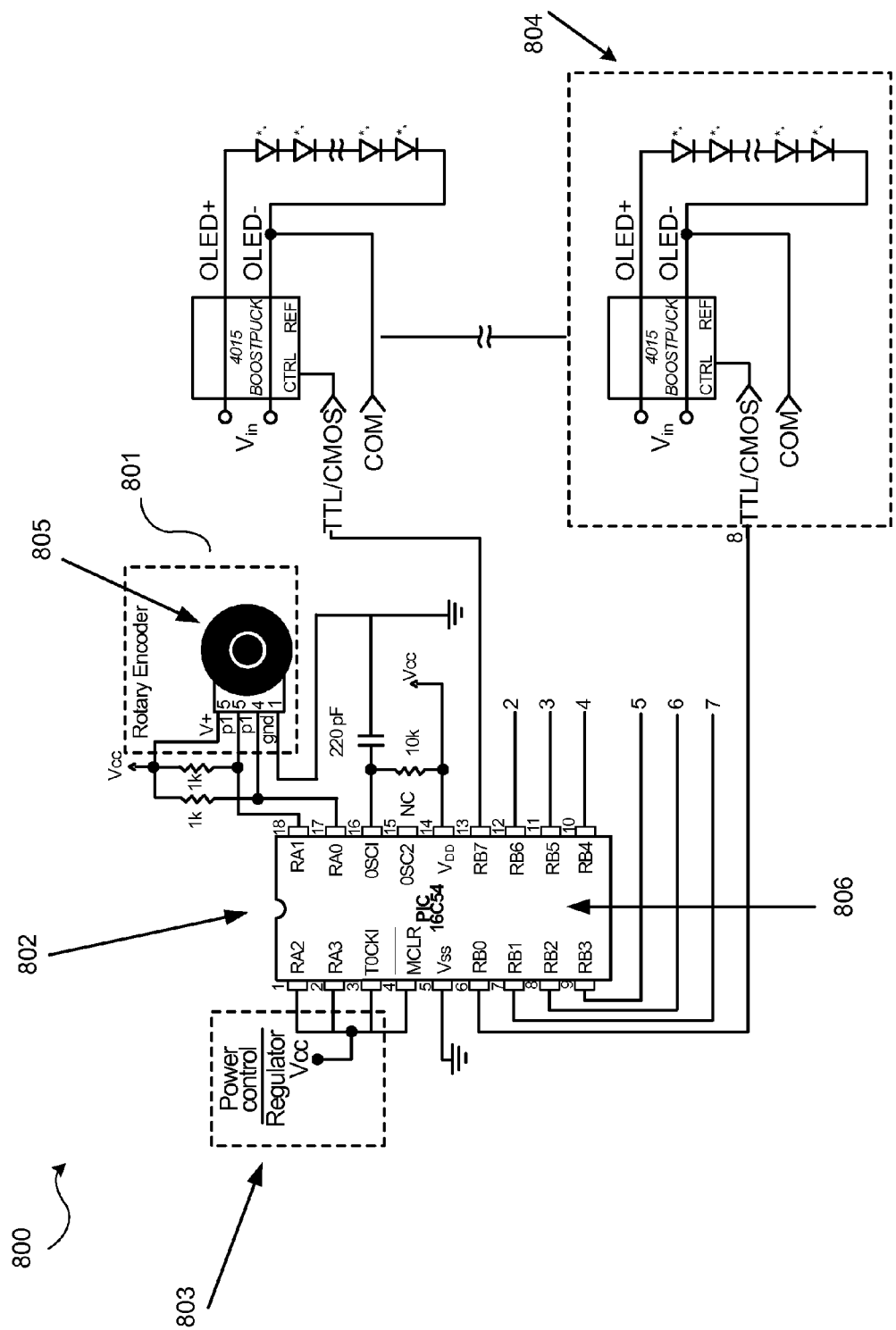
FIG. 8 shows an exemplary driving unit according to some embodiments.

Embodiments may utilize any suitable method or components to energize the appropriate portions of the light emitting area (e.g. to energize the appropriate lighting devices disposed on a substrate), including the use of analog or digital sensors and related control circuitry (i.e. a "driving unit"). In some embodiments, for instance, a mandrel is utilized in which the light emitting area of the device (e.g. a substrate comprising a plurality of lighting devices) is wrapped around and is coupled to a rotor. The rotor could operate as a reluctor with an optical sensor or a hall sensor to determine the position of the substrate. In some embodiments, a rotary encoder or potentiometer may be attached or coupled to either the mandrel or rotor. These methods and devices may then be used to determine the position of the substrate so as to illuminate sections of the light source as it is deployed from the housing (i.e. as it is unrolled from the mandrel). In some embodiments, control electronics (e.g. sensors, logic, etc.) may activate a current source based on timing. As noted above, the associated electronics could operate using either digital or analog methods in order to receive signals, pulses, voltages or currents from the control electronics. An exemplary embodiment of a driving unit is shown in FIG. 8, and will be described in detail below.

Figure 7:
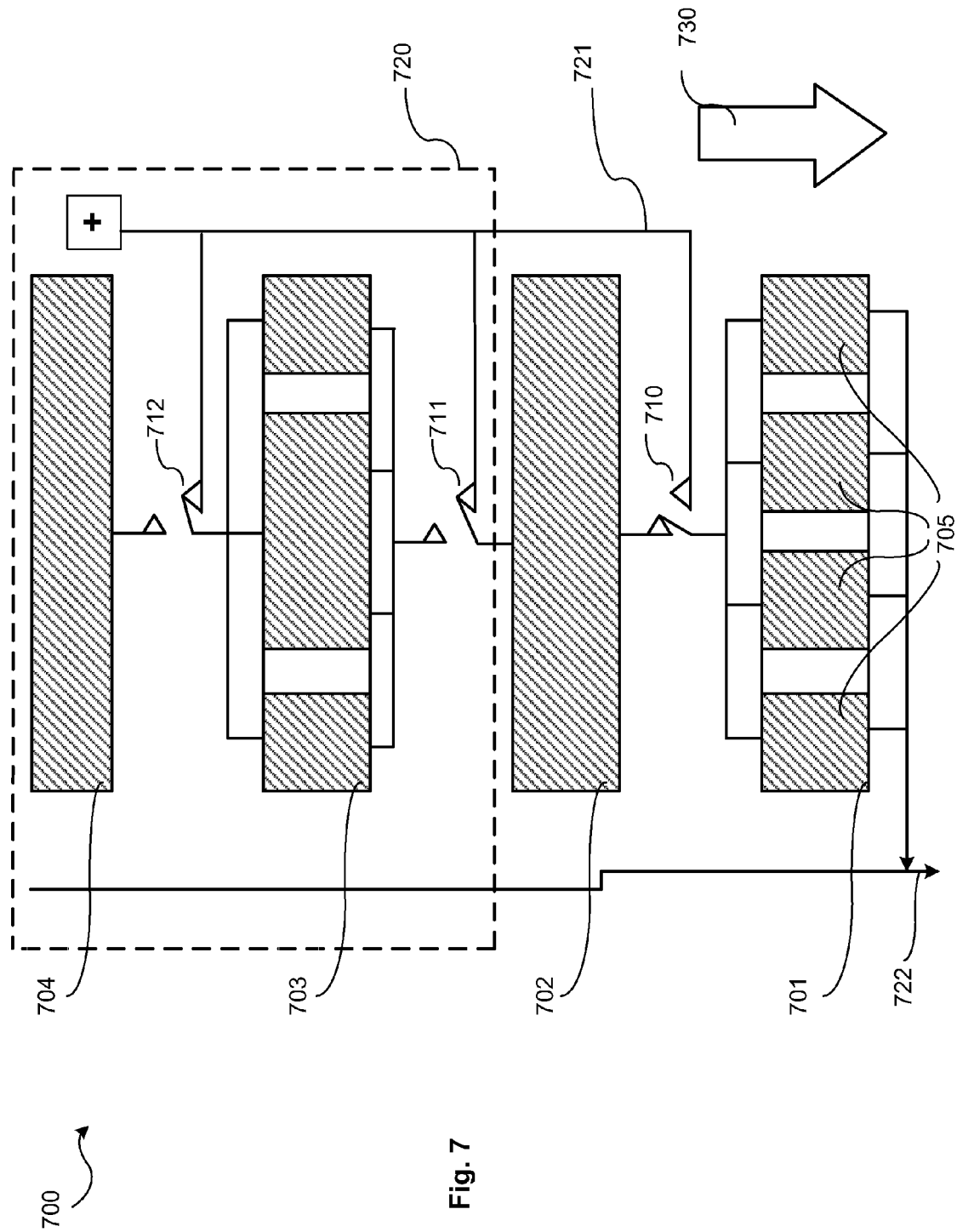
FIG. 7 shows an exemplary device according to some embodiments comprising a plurality of portions of OLEDs switchably connected in series.

In some embodiments, electromechanical switches may be utilized to control the unused portion of the light source. Exemplary embodiments of the use of such switches are shown in FIGS. 5-7. For instance, the switches may open when actuated (e.g. when the portion of the light emitting area is in a housing). The switches may be mounted in any suitable location, including on the back of the light source (i.e. on a side opposite of where light is emitted from the light devices). In some embodiments (for instance embodiments comprising a mandrel) the switches may actuate as the substrate is rolled onto itself (i.e. "rolled up"). In some embodiments, a mechanism could be used to create interference and actuate the switches as the light source is retracted (e.g. the switches could be located on the edge of the housing rather than the back of the devices, and coupled be actuated as that portion of the device enters or exits the housing). However, the switches may be located in any suitable location and may be actuated in any suitable manner.

Exemplary Embodiments

Described below are exemplary embodiments of devices comprising a light emitting area that includes a substrate having a plurality of lighting devices disposed thereon, where the plurality of lighting devices may be selectively energized based on the movement and/or position of the substrate. The embodiments described below are for illustration purposes only and are not thereby intended to be limiting. After reading this disclosure, it may be apparent to a person of ordinary skill that various components as described below may be combined or omitted in certain embodiments, while still practicing the principles described.

Embodiments may provide an extendable light source with a variable light emitting area. A first device is provided that includes a support, a first substrate movably coupled to the support, and a plurality of lighting devices disposed on the first substrate. That is, for instance, the first device may comprise a support as defined above (e.g. a rod, a housing, etc) that is coupled to a substrate such that the substrate may be moved relative to the support. The substrate may comprise any suitable material, such as glass, plastic, or a metal foil, and may be transparent, translucent, or opaque (for transparent and translucent embodiments, the lighting device may emit light through the substrate—such as with a transparent OLED). Although it may be preferred in some embodiments that each of the plurality of lighting devices be disposed directly on the substrate (e.g. by depositing the layers of the lighting devices onto the substrate using any of the deposition techniques known in the art, including those described above), embodiments are not so limited (i.e. there may be one or more layers of material disposed between the substrate and the layer of materials that comprise the lighting devices). For instance, each of the plurality of lighting devices may be deposited on a separate substrate, which is then directly coupled to the substrate that is common to each lighting device and which is movably coupled to the support. However, it may be preferred that the plurality of lighting devices are disposed directly onto the common substrate so as to reduce manufacturing costs and complexity.

The plurality of lighting devices disposed on the substrate include a first portion of lighting devices and a second portion of lighting devices. That is, at least two separate portions or groups of lighting devices may be defined, such that each of the first and second portions of the plurality of lighting devices may thereby comprise one or more lighting devices. It should be understood that embodiments may comprise more than two portions of lighting devices (indeed any desired number of portions may be used). The first device also includes an energizing component that is configured to selectively energize at least the first portion and the second portion of lighting devices based on a position of the first substrate relative to the support. That is, current may be supplied to the first portion but not the second portion of lighting devices; the second portion but not the first portion of lighting devices; both the first portion and second portion of lighting devices; or neither the first portion or the second portion of lighting devices based on the position of the substrate. For example, if the substrate is moved relative to the support (e.g. the substrate is pulled or removed from a housing, unrolled from having been wrapped around a rod, etc.) the first portion of the plurality of lighting devices may be energized by the energizing component. Initially, the second portion of the plurality of lighting devices may not be energized. If the substrate is moved further, then eventually the second portion of lighting devices may also be energized (e.g. after the second portion is pulled from the housing or unrolled from the rod). In this way, embodiments may provide a device that only energizes the lighting devices disposed on a movable substrate that are in a position to be effectively utilized (e.g. that would not have the light emitted blocked by a housing or otherwise limited). In some embodiments, the first device may be configured such that whenever current is supplied to the second portion of the plurality of lighting devices, current is also supplied to the first portion of lighting devices. This may be the case, for instance, if the first portion of the plurality of lighting devices is located on a section of the substrate that is exposed from a housing (or otherwise in a position to be utilized) prior to the second portion when the substrate is moved from the support in a direction. Example embodiments showing such embodiments are discussed below with reference to FIGS. 3-7. The energizing of each of the plurality of lighting devices may be performed using any known method, including by controlling the voltage or the current provided to each lighting device.

In this manner, the first device may provide for selectively energizing a portion (e.g. the first portion, the second portion, or both) based on the relative position of the substrate. Embodiments may provide some advantages. For instance, some embodiments may operate more efficiently, as only the light devices that are needed (or in a position to be effectively used) are energized, thereby reducing the power used by the device when the substrate is not fully extended. In addition, embodiments may provide for increased flexibility and utility, as the first device may be operated when less than the entire substrate is extended, unrolled, etc. This may permit the use of the device in many circumstances, including when less luminance than the entire device can provide is desired. Furthermore, device lifetime may be improved, as fewer of the lighting devices are energized when their emissions are not needed, which can also reduce heating of the device (particularly in embodiments that comprise a housing that contains a portion of the substrate).

In some embodiments, in the first device as describe above, the first portion and the second portion of the plurality of lighting devices are switchably connected in parallel with each other. That is, for instance, as the substrate is extended in a direction away from the support, the first portion (which may comprise one or more lighting devices) may be electrically connected in parallel with the second portion (which may also comprise one or more lighting devices) of the plurality of lighting devices based on a position of the substrate. Such embodiments may be utilized so as to provide a relatively constant current density to the lighting devices as additional portions of the plurality of lighting devices are connected in parallel. This may thereby result in the first device maintaining a relatively constant brightness as additional portions of lighting devices are energized as the substrate is moved away from the support. In this manner, in some embodiments, the applied voltage will be relatively constant and the injected current will be increased as the substrate is moved away from the support. Example embodiments of portions of the plurality of lighting devices switchably connected in parallel are described below with reference to FIGS. 5 and 6.

In some embodiments, in the first device as described above, the first portion and the second portion of the plurality of lighting devices are switchably connected in series with each other. That is, as the substrate is extended in a direction away from the support, the first portion (which may comprise one or more lighting devices) may be electrically connected in series with the second portion (which may also comprise one or more lighting devices) of the plurality of lighting devices based on a position of the substrate. In this manner, in some embodiments, the applied voltage will increase as the substrate is moved away from the support and the injected current will be relatively constant. Example embodiments of portions of the plurality of lighting devices switchably connected in series are described below with reference to FIG. 7.

It should be understood that the first and second portions (and any other portions of lighting devices that may be selectively energized) may be electrically connected in any suitable manner. For example, embodiments may provide that a first portion and a second portion of the plurality of lighting devices disposed on the substrate are switchably connected in series, and a third portion of the plurality of lighting devices is switchably connected in parallel with both the first and second portions (or either the first or the second portions alone). Again, any combination of electrical connections may be utilized for additional lighting devices that are energized as the substrate is moved relative to the support.

In some embodiments, in the first device as described above, the first portion of the plurality of lighting devices includes a plurality of lighting devices electrically connected in a first series and the second portion of the plurality of lighting devices includes a plurality of lighting devices electrically connected in a second series. The first and the second series are switchably connected in parallel with each other. Exemplary embodiments are again illustrated with reference to FIGS. 5 and 6 and described below. As noted above, the first portion and the second portion of the plurality of lighting devices may be switchably connected in any suitable manner.

In addition, although expressly described as being connected in series, the plurality of lighting devices that comprise each portion (e.g. the first portion, second portion, etc.) may also be connected in any suitable manner, including in series or in parallel. It is generally preferred that for embodiments wherein the lighting devices comprise OLEDs, that the devices are connected in series because OLEDs tend to fail short. Thus, if one device were to fail, the other devices connected in series would still likely have acceptable performance (although the amount of current may increase slightly if energized by a voltage source), whereas if the devices are connected in parallel, a short fault may result in substantially no current flowing to the other lighting devices. The opposite is typically true when the lighting devices comprise one or more LEDs, which typically fail open. That is, for instance, if a device that is electrically connected in a series fails open, than no current can flow to the other devices in the series, whereas if a device electrically connected in parallel fails open, the other devices may continue to operate at acceptable performance levels (with a slight increase in current if energized by a current source).

In some embodiments, in the first device as described above, the plurality of lighting devices further includes a third portion of lighting devices. The energizing component is further configured to selectively energize the first portion, the second portion, and the third portion of lighting devices based on a position of the substrate relative to the support. As was described above, the first device may comprise any number of portions of lighting devices. Typically, the more portions that are provided that may be selectively controlled based on the position of the substrate, the more flexibility the device will have, as it may comprise more operating conditions (i.e. more positions at which different total light emissions are provided). Some embodiments may thereby have expanded utility, as they could provide devices that may be used, for instance, to provide a more customizable amount of light to better suit the needs of the user. These designs may also be more robust to device failure, in that failure of one portion of lighting devices may comprise a smaller percentage of the total output potential of the device, and thus a device having more portions of devices that may be selectively controlled may continue to operate at acceptable performance levels despite the fails of some portions of the lighting devices.

In some embodiments, in the first device as described above, the plurality of lighting devices includes a plurality of organic light emitting devices (OLEDs). Each of the OLEDs has a first electrode, a second electrode disposed over the first electrode, and an organic electroluminescent (EL) material disposed between the first and the second electrodes. The use of OLEDs may be preferred in some embodiments because such devices may provide for the use of flexible substrates (which may be utilized, for instance, in embodiments comprising a substrate wrapped around a rod). OLEDs may also operate at lower junction temperatures than other lighting devices, which may decrease temperature effects when the lighting devices are located in close proximity, and thereby reduce temperature related degradation in the first device. The organic lighting devices may comprise any type of OLED, including stacked (SOLEDs) and transparent (TOLEDs). In addition, the OLEDs may comprise any number of emissive materials. For instance, in some embodiments, the OLEDs may comprise yellow and blue (or red, blue, and green) emissive materials so as to emit white light. In some embodiments, the first portion or the second portion may comprise a plurality of OLEDs, some of which may emit light having a different color (i.e. having different wavelengths). Similarly, the first portion and the second portion of the plurality of lighting devices may each comprise OLEDs that emit light of a single color, but the light emitted by the OLEDs in the first portion is different than the light emitted by the second portion. In this regard, novel devices that change emissive colors as the substrate is moved toward or away from the support are provided. It should be understood that any combination of OLEDs, including OLEDs that emit light having different wavelengths, may be utilized. Although described with referenced to OLEDs, it should be understood that different color emitting lighting devices may be used for any type of lighting device, including LEDs.

In some embodiments, in the first device as described above where the plurality of lighting devices includes a plurality of OLEDs, the first electrode, the second electrode, or the organic EL material of each the plurality of OLEDs is patterned. By patterning one of the electrodes, embodiments may provide for both addressing the OLEDs selectively, and or connecting a plurality of the OLEDs in series (whether connecting OLEDs in the same portion of the plurality of OLEDs or connecting different portions of the plurality of OLEDs). In addition, patterning the EL material may allow for the device to comprise that emit light having different wavelengths (i.e. different color light). However, patterning components may require a deposition process that requires the use of a fine metal mask, or other similar process, which can increase the cost of fabrication. Therefore, in some embodiments, the first electrode of each of the plurality of OLEDs is patterned and the second electrode of each of the plurality of OLEDs is common. By "common," it is meant that the second electrode is utilized by more than one lighting device (i.e. a single layer comprises the second electrode for multiple OLEDs). This may reduce the number of fine metal mask deposition processes required, while still permitting individual OLEDs to be addressed and/or connected in series or parallel as desired. However, embodiments are not so limited. For instance, in some embodiments, the first electrode and the second electrode of each of the plurality of OLEDs is patterned. Descriptions of exemplary embodiments comprising OLEDs connected in series and/or in parallel are provided in U.S. Pat. No. 7,576,496, U.S. Pat. No. 7,034,470 and U.S. Pat. No. 6,870,196, each of which is hereby incorporated by reference in their entireties.

In some embodiments, in the first device as described above, the plurality of lighting devices comprises a plurality of LEDs. As noted above, LEDs typically fail open, so it may be preferred that in such embodiments, the LEDs are connected in parallel such that if one fails open, the entire light device (or a large portion thereof) is not rendered inoperable. In contrast, OLEDs typically fail short, and therefore it may be preferred that embodiments comprising OLEDs have the lighting devices electrically connected in series so that if one lighting device fails short, the device still operates within acceptable parameters.

In some embodiments, in the first device as described above, the support includes a housing that is configured to selectively contain or expose the first and second portions of lighting devices disposed on the first substrate. A "housing" as used herein, may comprise any apparatus, device or component that that may contain some or all of the substrate of the first device. The housing may comprise any shape, including cylindrical, rectangular, triangular, circular, etc. The housing may comprise a cavity or an area in which portions of the substrate that comprise lighting devices that are not energized are stored. The housing may also comprise the portion of the support to which the substrate is movably attached and may comprise an opening through which the substrate may be extracted and moved into the housing. The term "selectively contain" may refer to a configuration such that the substrate (or a portion thereof) may be removed or replaced with the housing, such as by applying a force to the substrate. It should be understood that as used herein, if the housing "comprises" a component or feature, it may also have other components or other features. For instance, if the housing comprises a rod, the housing may also comprise other structural components, such as a compartment for holding the substrate, a power source, a support structures for holding the rod, an opening for receiving and extracting the substrate, etc.

Continuing with these exemplary embodiments, the energizing component may be configured in some embodiments to energize the first portion of the plurality of lighting devices when the first portion is not contained within the housing, and to not energize the first portion of the plurality of lighting devices when the first portion is contained within the housing. The energizing component may also be configured to energize the second portion of the plurality of lighting devices when the second portion is not contained within the housing, and to not energize the second portion of the plurality of lighting devices when the second portion is contained within the housing. That is, in some embodiments and as described above, the first device may be configured so that only lighting devices that are on sections of the substrate that are outside of the container are energized so as to emit light, while the remaining portions are not energized. As the substrate is moved, more sections of the substrate (and thereby more portions of the plurality of lighting devices) may be exposed (i.e. may be disposed outside of the housing) and may then be energized by the energizing component. This may thereby provide a device that is more efficient based in part on the fact that it does not unnecessarily energize lighting devices disposed on the substrate that are not in use and/or the light of which would be substantially blocked by the housing.

Continuing still with the embodiments described above, in some embodiments the housing may include one or more portions of OLEDs configured to replace one or more other portions of OLEDs. That is, for instance, the housing may contain a plurality of portions of OLEDs designed to replace one or more portions of OLEDs (that may, for instance, be disposed outside of the housing more frequently) at the end of their respective lifetimes. In some embodiments, the replacement OLEDs may be disposed on the same substrate as the OLEDs that are to be replaced. The section of the substrate that the replacement OLEDs are located on may be located closer to the support than the OLEDs that are to be replaced, such that, in some embodiments, the replacement OLEDs may be disposed within the housing when the OLEDs to be replaced are disposed outside of the housing for some positions of the substrate. Such embodiments could, for example, address the limited operating lifetime of OLEDs grown on flexible substrates by allowing for an area of light emitter to be energized outside of the housing until the quality of light is no longer acceptable. That area may then, for example, be cut, torn or otherwise removed and a new area to be extended from the housing and illuminated (preferably automatically). In some embodiments, it may be preferable for the portions of OLEDs within the housing to remain unenergized so that these portions suffer only shelf degradation, whereas the energized portions of OLEDs disposed outside of the housing may experience operating degradation. For example, in some embodiments an extendable structure (such as a roll that may be wrapped around a rod) could form the basis of a disposable OLED lamp where sections that have degraded beyond acceptable performance are simply torn off and a new section is extended (e.g. rolled out) that automatically illuminates as it is extended (e.g. unrolled).

In some embodiments, in the first device as described above, a first, a second, and a third position are defined for the first substrate. The "position" of the substrate may refer to the relative position of the substrate to the support and thereby correspond to when various amounts of the substrate is exposed from a housing or is otherwise in a position to be used or activated (such as, for instance and as described above, when the substrate or a portion thereof is unrolled). As noted above, a portion of the substrate may be "unrolled" if the portion of the substrate does not substantially overlap and/or is not disposed over another portion of the substrate. The position may also refer to the position of a point on the substrate relative to the support. That is, as the substrate is moved relative to the support, it may enter any number of positions.

Continuing with these exemplary embodiments, in some embodiments the energizing component is configured to not energize either of the first portion or the second portion of the plurality of the lighting devices when the first substrate is in the first position, to energize the first portion but not the second portion of lighting devices when the first substrate is in the second position, and to energize both the first portion and the second portion of lighting devices when the first substrate is in the third position. That is, for instance, the first position of the substrate may correspond to a position in which the sections of the substrate that comprises either of the first portion or the second portion of the plurality of lighting devices is to be activated (such as, for instance, if both portions are disposed within a housing and/or are not unrolled from the other portions of the substrate). The second position of the substrate may be defined as a configuration in which the section of the substrate that comprises the first portion of the lighting devices disposed thereon is in a position that is to be activated (such as, for instance, if the first portion is disposed outside of a housing or is unrolled from the substrate), whereas the section of the substrate on which the second portion of the plurality of lighting devices is disposed is not in a position or location to be activated (e.g. it is not unrolled from the other portions of the substrate or disposed outside of a housing). Similarly, the third position may correspond to the configuration wherein both the first and second light devices are disposed such that they are to be activated. Although as described above, reference was made with regard to the positions of the substrate corresponding to when the sections of the substrate that comprise the lighting devices were unrolled or disposed outside of a container, embodiments are not so limited. For instance, in some embodiments, a lighting device may be disposed outside of a housing, but it may not be activated. This may be the case in some embodiments where, for instance, a minimum distance away from the housing is set before the lighting devices are activated.

In some embodiments, in the first device as described above where a first, a second, and a third position are defined for the first substrate, and the energizing component is configured to not energize the first or the second portion of the plurality of lighting devices in the first position; to energize the first but not the second portion of the plurality of lighting devices in the second position; and to energize both the first and the second portion of the plurality of lighting devices in the third position, the support of the first device may further include a rod. A "rod" as used herein may refer to a bar, tube, a cylinder, etc. that serves as a core around which material (e.g. the substrate) may be molded, bent, wrapped around or otherwise shaped around. While it is preferred that the rod is cylindrical, it is not required and may take any suitable form. The first portion and the second portion of the plurality of lighting devices substantially wrap around the rod when the first substrate is in the first position. When the substrate is in the second position, the second portion but not the first portion of the plurality of lighting devices substantially wrap around the rod. When the first substrate is in the third position, both the first portion and the second portion of the plurality of lighting devices do not substantially wrap around the rod. That is, for instance, in some embodiments, the first position of the substrate may correspond to a position in which the sections of the substrate that comprise the first portion or the second portion of the plurality of lighting devices are not unrolled from the other portions of the substrate that are wrapped around the rod. The second position of the substrate may be defined as a configuration in which the section of the substrate that comprises the first portion of the lighting devices disposed thereon is unrolled from the other portions of the substrate, whereas the section of the substrate on which the second portion of the plurality of lighting devices is disposed on is not unrolled from the other portions of the substrate. Similarly, the third position may correspond to the configuration wherein both the first and second light devices are unrolled from the substrate and may be thereby energized by the energizing component so that the lighting devices are activated. In this manner, embodiments may provide for the selective activation of portions of an extendable illumination source based on the position of the substrate so that the device operates more efficiently.

Continuing with this embodiments, in some embodiments, the rod includes a power source, which may for instance comprise a battery. By including a power source such as a battery, this may provide for a first device that is mobile (i.e. that does not require a plug-in power source). In addition, including the battery with a structural component such as the rod itself may also be a convenient location to store the power source so as to minimize the size of the device. In some embodiments, the rod includes the energizing component, which may comprise a voltage or a current source. In this manner, the components that are needed to operate the device in some embodiments may be self contained within the rod or in another aspect of a support structure of housing. This may provide for devices that may be used in many applications, and may be more readily transported. Also, locating the energizing component inside the rod, for instance, may protect these components from exterior forces that could damage them if located elsewhere.

In some embodiments, the first device may further comprise an electric motor coupled to the support that may move the physical position of the substrate relative to the support. That is, for instance, in some embodiments, where the support of the first device comprises a rod, an electric motor may be connected to the rod so as to rotate the rod clockwise and/or counterclockwise. The electric motor may be used, for instance, to move the substrate into and out of a housing or otherwise move portions of the substrate into a position where the lighting devices thereon may be activated. In some embodiments, a mechanical device (such as a spring) may be used to move the substrate relative to the support (such as a coiled spring for retracting the substrate. In some embodiments, a manual device (such as a crank or handle) may be provided that is coupled to the support or substrate that a force may be applied to by a user to move the substrate relative to the support.

In some embodiments, in the first device as described above, where the energizing component is configured to energize neither the first portion nor the second portion of lighting devices when the first substrate is in the first position, to energize the first portion but not the second portion of lighting devices when the first substrate is in the second position, and to energize both the first portion and the second portion of lighting devices when the first substrate is in the third position, the support includes a housing that is configured to selectively contain some or all of the first substrate. In the first position, the first portion and the second portion of the plurality of lighting devices are substantially contained within the housing. In the second position, the second portion but not the first portion of the plurality of lighting devices is substantially contained within the housing. In the third position, both the first portion and the second portion of the plurality of lighting devices are not substantially contained in the housing. That is, for instance, the first position of the substrate may be defined as the configuration of the first device wherein the substrate (or at least the portion of the substrate that comprises the first and second portions of the lighting devices) is contained within the housing. The energizing component may be configured to not energize either of the portions of the lighting devices in the first position because these portions are not in a position to be effectively utilized. As the substrate is moved relative to the support, it may enter a second position in which the first portion of the plurality of lighting devices (and the portion of the substrate that the lighting devices are disposed on) is exposed (i.e. is disposed outside of the housing), but wherein the second portion of the plurality of lighting devices remains disposed within the housing. The energizing component may be configured to energize the lighting devices of the first device that are thereby disposed outside of the housing (for instance, at least the first portion of the plurality of the device). Similarly, the third position may be defined as when the substrate has moved into a position relative to the housing in which the first and second portions of the plurality of lighting devices are disposed outside of the housing. The energizing component may again be configured to energize the lighting devices of the first device that are thereby located outside of the housing (for instance, at least the first and second portions of the plurality of the device).

In some embodiments, the housing has a shape that is substantially cylindrical or rectangular. Cylindrical and rectangular shapes may preferred in some embodiments, such as, for instance, when the substrate comprise a flexible material or if there is a preference for compact or aesthetic storage in such shapes. Examples may include a large area lighting panel for a room that may cover a wall, window, portions of a ceiling, etc when in use, but when not in use, may be stored in an inconspicuous manner. A box or rectangular shape may be preferred in some embodiments when the substrate comprises a rigid material and/or when the use for the device may be conducive to such a shape. Examples may include, for instance, lighting for a desk or work space, lighting for a rectangular cabinet or drawer, lighting for use in a handheld mirror, novelty lamps, etc. However, it should be understood that the shape of the housing may depend on a variety of factors, such as whether the substrate is flexible or rigid, the purpose or application desired of the first device, the cost of the device, etc.

In some embodiments where the first device comprises a housing, the support of the first device further includes a rod such that portions of the first substrate may substantially wrap around the rod when the portions of the first substrate are contained within the housing. In some embodiments, the rod is contained substantially within the housing. That is, the rod may be disposed within the housing, and the portions of the substrate that are also disposed in the housing may be wrapped around the rod. In this manner, the substrate may be readily stored in an efficient manner that reduces the amount of space required. In addition, the use of the rod (and the substrate wrapped around the rod) may provide an efficient manner to move the substrate relative to the housing, as the rod may rotate according to the force applied to the substrate. This manner of extending and retracting the substrate may, in certain instances, provide a compact storage method that is readily entered into when the device is not in use (for instance. The substrate may be extended or contracted through the use of any suitable means, including by way of example, using a simple mechanical retraction method such as a spring (e.g. a spiral spring that may rotate to retract the screen or keep it taught), manual device such as a crank or other handle that may be used by a person to rotate the cylinder, or an electric motor that rotates the cylinder.

In some embodiments, in the first device as described above, where the energizing component is configured to energize neither the first portion nor the second portion of lighting devices when the first substrate is in the first position, to energize the first portion but not the second portion of lighting devices when the first substrate is in the second position, and to energize both the first portion and the second portion of lighting devices when the first substrate is in the third position, the energizing component includes a first contact electrically connected to the first portion of the plurality of lighting devices, a second contact electrically connected to the second portion of the plurality of lighting devices, and a third contact electrically connected to a voltage source or a current source. That is, the first contact may comprise a component of a conductive path to the first portion of the plurality of the lighting devices such that an electrical connection that supplies current or voltage to the first contact will energize the first portion of the plurality of lighting devices. Similarly, the second contact may comprise a component of a conductive path to the second portion of the plurality of lighting devices such that an electrical connection that supplies current or voltage to the second contact will energize the second portion of the plurality of lighting devices. The third contact may be connected to a voltage or current source, such that when contact is made with the first or the second electrical contact, current may flow through the first or second portion of the plurality of lighting devices, respectively. The third contact does not electrically connect to either the first or the second contact when the first substrate is in the first position. The third contact electrically connects to the first contact but not the second contact when the first substrate is in the second position. The third contact electrically connects to the first contact and the second contact when the first substrate is in the third position. In this manner, exemplary embodiments may selectively energize portions of the plurality of the lighting devices based on the relative position of the substrate. Exemplary embodiments are shown in FIGS. 5 and 6 described below, which are for illustration purposes only and are not meant to be limiting.

Continuing with these exemplary embodiments, in some embodiments, the third contact comprises an electrical conductor that extends in a direction that is substantially parallel to the direction that the substrate moves when going from the first position to the second or the third position. This embodiment is shown in FIG. 5, and described below. In some embodiments, the third contact comprises a plurality of switches, where each switch is selectively connected to a voltage source, a current source, or a plurality of lighting devices, or both. In some embodiments, each switch selectively connects a plurality of lighting devices to at least one of a voltage source or a current source. That is, for instance, a switch or switches connecting the first and second contact to the voltage or current source may be actuated when the substrate is in the third position; a switch or switches connecting the first contact but not the second contact to the voltage or current source may be actuated when the substrate is in the second position; and no switches may be actuated that would connect the first and second contact to the voltage or current source when the substrate is in the first position, where the positions are as defined as above. A "switch" may comprise any suitable device known in the art including, for example, a spring contact or a semi-conductor switch (such as a transistor circuit).

In this regard, in some embodiments, where the first device comprises a plurality of switches, and the plurality of switches comprises a first switch that selectively connects the first contact to at least one of a voltage source or current source when activated, and a second switch that selectively connects the second contact to a voltage or current source when activated. When the first substrate is in the first position, the first switch and the second switch are not activated. When the first substrate is in the second position, the first switch is activated and the second switch is not activated. When the first substrate is in the third position, the first switch and the second switch are activated. Similar embodiments were discussed above, and may provide the first device with the ability to selectively energize portions of the plurality of lighting devices based on the relative position of the substrate. It may be preferred in some embodiments to utilize switches as they may be activated using control systems that respond to data collected from, for example, sensors that indicate the position of the substrate, or through the use of mechanical components that actuate the switch (e.g. mechanical components disposed at locations where the portions of the lighting devices, or electrical contacts, pass). In this regard, it may be preferred to use an electronic switch or circuit so as to not require the use of the additional mechanical components that may be located, for instance, at the opening of a housing where the substrate is extended and retracted. However, embodiments are not so limited and thereby the first switch and the second switch may comprise either mechanical or electronic switches or circuits. In some embodiments, the support comprises a housing configured to selectively contain some or all of the first substrate that includes an opening for receiving some or all of the substrate. In some embodiments, the first and the second switches are activated by at least one of a physical protrusion, a capacitance switch, or a proximity switch located at or near the opening of the housing. In this manner, some embodiments may provide devices that activate the lighting devices upon exiting the housing when the lighting devices are disposed such that their emissions may be used for illumination purposes.

In some embodiments, in the first device as described above, the energizing component comprises a driving unit. The driving unit includes a sensing module configured to determine the position of the first substrate. That is, the sensing module may receive information from one or more sensors (such as optical sensors, variable resistors, etc.) that indicates the relative position of the substrate and or lighting devices disposed thereon. This information may then be relayed to other components of the driving unit. The driving unit may also comprise a control module configured to determine which of the plurality of lighting devices to supply current to based on the position of the first substrate. That is, the control module may receive data from the sensing module indicating the relative position of the substrate, and using hardware or software logic that may comprise predetermined rules and/or algorithms, determines the portion of the plurality of lighting devices that are to be energized by a current. The driving unit may further comprise a power source (such as a voltage source or a current source) and one or more lighting device drivers that are electrically connected to the plurality of lighting devices, wherein the lighting device drivers are configured to control the brightness of the plurality of the lighting devices. Controlling the brightness may include whether to energize the a lighting device at all, or may comprise determining the amount of current or voltage to supply to one or more lighting devices. In this regard, in some embodiments, the one or more lighting device drivers control the brightness of the plurality of lighting devices by controlling at least one of the current or the voltage that is supplied to each of the lighting devices. In some embodiments, the lighting device drivers may also be configured to determine the amount of power and voltage to energize the plurality of lighting devices. That is, lighting device drivers may determine the drive current or voltage required to operate the display at a particular brightness or luminance level. This may vary, for example, based on the size of the activated light emitting area and the number of lighting devices disposed thereon that are to be energized. In some embodiments, the lighting device drivers may also monitor the amount of current and voltage supplied and adjust this value as needed (e.g. to maintain constant current or voltage). An exemplary embodiment provided for illustration purposes only of a driving unit is shown in FIG. 8.

Figure 3:
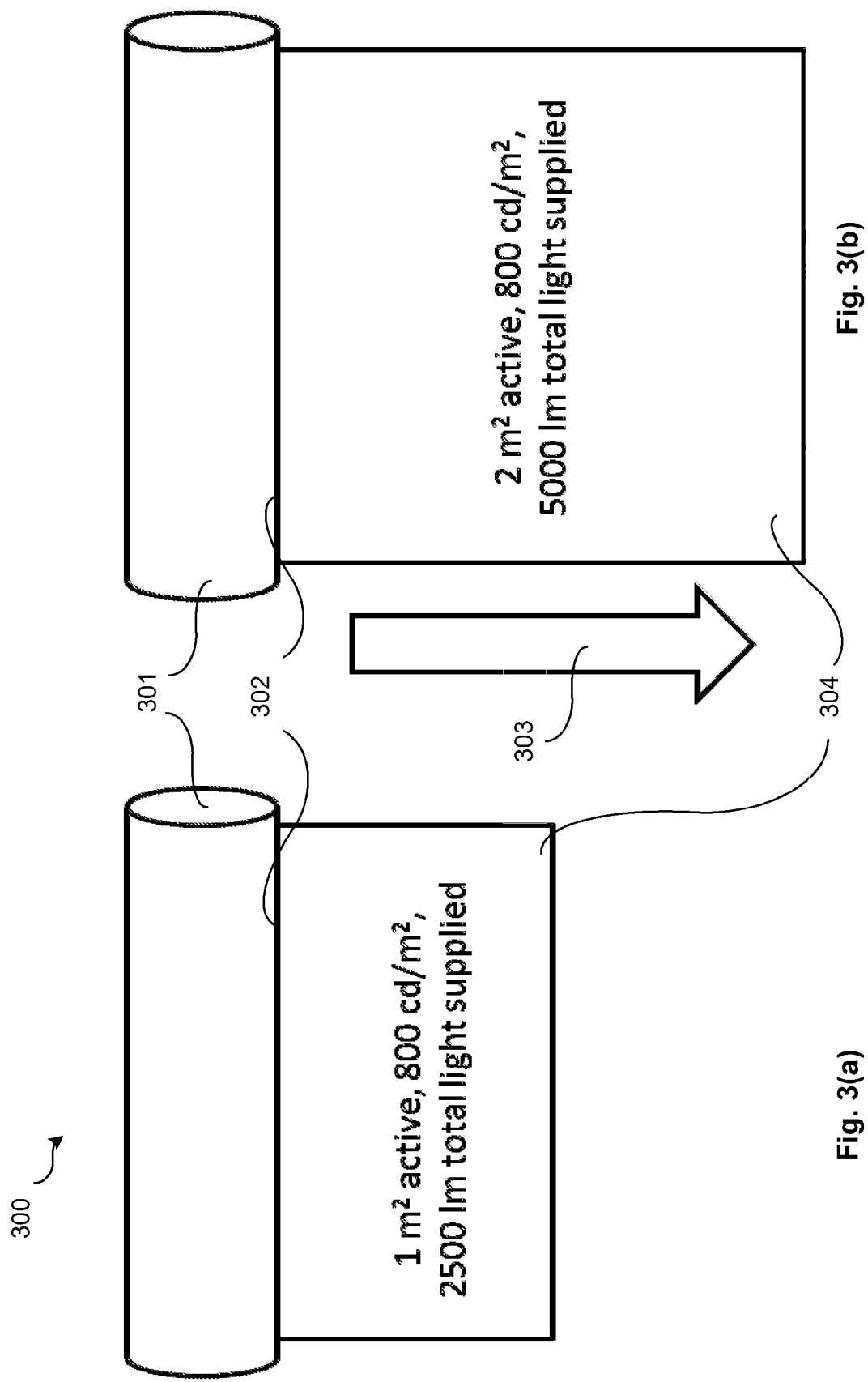
FIGS. 3(a) and (b) show an exemplary device according to some embodiments comprising a flexible substrate.
Figure 4:
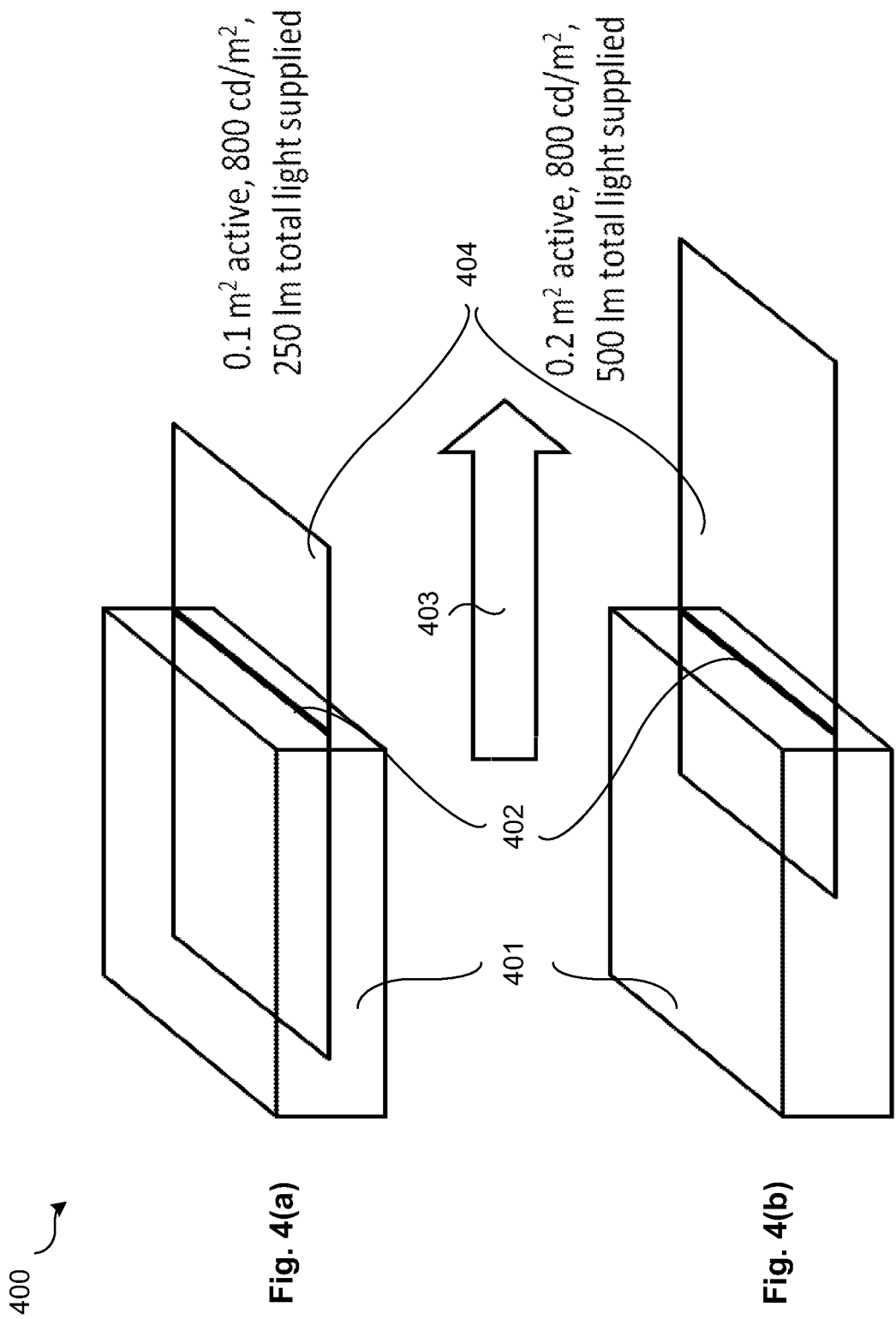
FIGS. 4(a) and (b) show an exemplary device according to some embodiments comprising a rigid substrate.

As noted and described above, the first device and or the substrate may have various properties. For instance, in some embodiments, in the first device as described above, the first substrate is flexible. An exemplary embodiment is shown in FIG. 3. This may allow for the substrate to be "rolled up" or otherwise disposed so as to use less space and thereby allow for a smaller first device. In some embodiments, the first substrate comprises a plastic foil or metal foil. In some embodiments, where the first substrate comprises metal foil, the plurality of lighting sources comprises top emission OLEDs. This may be more efficient than a TOLED, wherein the light emitted in the direction of the substrate (which is opaque) is then reflected or absorbed by the substrate. In some embodiments, in the first device as described above, the first substrate is rigid. An exemplary embodiment is illustrated in FIG. 4 and described in more detail below. While it may generally be desirable to utilize a flexible substrate because it may reduce space (particular when the first device is not in use) as shown, it may be preferred for some applications that a rigid substrate is utilized.

In some embodiments, in the first device as described above, the lighting devices emit substantially white light. "Substantially white light" may refer to light that has a point on the CIE 1976 (L*, u*, v*) color space chromaticity diagram that lies within a Duv distance of 0.010 from the Planckian locus. "Duv" refers to the minimum distance in the CIE 1976 (L*, u*, v*) color space chromaticity diagram of the lighting device chromaticity from the blackbody curve. That is, Duv is a measure of the difference in chromaticity between a lighting device and a blackbody radiator of equivalent correlated color temperature. This can be quantified in terms of $Duv=\sqrt{(\Delta u'^2+\Delta v'^2)}=\sqrt{((u1'-u2')^2+(v1'-v2')^2)}$, where (u1', v1') are the coordinates of the lighting device, and (u2', v2') are the coordinates of the blackbody curve at the minimum distance from the lighting device in the CIE 1976 (L*, u*, v*) color space chromaticity diagram.

In some embodiments, the first device as described above comprises a task lamp or a novelty lamp. However, embodiments are not so limited. A novelty lamp may comprise many of the features noted above, including variable brightness based on the number of lighting devices activated, differing color light emitted from the first device based on the position of the substrate, etc.

Embodiments may also provide a device that includes a support and a first substrate movably coupled to the support. A plurality of portions of lighting devices are disposed on the first substrate, wherein each portion comprises one or more lighting devices. The device also includes an energizing component that is configured to selectively energize each of the portions of lighting devices based on a position of the first substrate relative to the support. That is, embodiments may have two or more portions of lighting devices. The lighting devices may be energized based on the position of the substrate relative to the support.

In some embodiments, in the device as described above, the support comprises a housing configured to selectively contain the portions of the substrate that comprise the plurality of portions of lighting devices. The energizing component is configured to energize the portions of lighting devices that are not contained with the housing and to not energize the portions of the lighting devices that are contained within the housing. The use of the housing may provide protection for the substrate that is not presently in use. Moreover, by not energizing lighting devices that are disposed on portions of the substrate that are located within the housing, embodiments may provide a more efficient illumination device, and/or also reduce temperature related degradation of the device that may otherwise occur if those portions in the housing were energized.

In some embodiments, in the first device as described above, the support includes a rod. The portions of the first substrate comprising the plurality of portions of lighting devices are configured to selectively wrap around the rod. The energizing component is configured to energize the portions of lighting devices that are not substantially wrapped around the rod and to not energize the portions of the lighting devices that are substantially wrapped around the rod. As described above, not energizing the lighting devices that are located on the portions of the substrate that are "rolled up" such that the sections of the substrate are overlapping and/or disposed over one another may provide similar benefits as those provided using a housing with regards to efficiency and degradation. In addition, the use of a rod may provide for easier movement of the substrate relative to the support. Such embodiments typically require that the substrate is of a flexible material, and it may thereby be preferred that the lighting devices comprise OLEDs.

Description of the Figures

The remaining figures will now be described in more detail. The figures represent exemplary embodiments and are not meant to be limiting. Many of the figures were referenced above, and thereby may pertain to the description provided as indicated.

With reference to FIG. 3, an exemplary device 300 in accordance with some embodiments is shown. As illustrated, the device 300 may comprise a rollable substrate 304 stored at least partially inside a housing 301. The housing 301 is illustrated as cylindrical in shape to minimize the required volume, however, embodiments are not so limited. As shown, the lighting devices (such as OLEDs) may be supported on a flexible substrate 304, which could comprise, for instance, a plastic foil (in which case the OLEDs could be top emitting or bottom emitting) or a metal foil (in which case the OLED is preferably top emitting).

As shown in FIG. 3(a) the substrate 304 is in a first position relative to a support, which may comprise the housing 301 or a portion thereof (or a component therein). A section of the substrate 304 that may comprise a portion of the plurality of lighting devices may be disposed within the housing 301. In this exemplary embodiment, only portions of the lighting devices that are disposed on the section of the substrate 304 that is located outside of the housing 301 may be energized so as to emit light. For instance, the light emitting area of the first device 300 in FIG. 3(a) may be 1 m$^2$ (corresponding to the area of the substrate 304), it may comprise a luminance of 800 cd/m$^2$, and may comprise 2500 lm of total light supplied. These values are provided for illustration purposes.

FIG. 3(b) shows the first device 300 wherein the substrate 304 is in a second position relative to a support (which may comprise the housing 301). That is, for instance, a force may have been applied to the substrate 304 in the direction indicated by the arrow 303 such that additional sections of the substrate 304 (and the lighting devices that are disposed thereon) have been extracted from the housing 301 through the opening 302. In this case, the additional lighting devices that are now exposed outside of the housing 301 may be energized by the energizing component of the first device. The light emitting area in this exemplary embodiment shown in FIG. 3(b), as illustrated, may thereby be larger than the light emitting area shown in FIG. 3(a). For instance, the light emitting area may comprise an area of 2 m$^2$, it may comprise a luminance of 800 cd/m$^2$, and it may comprise 5000 lm of total light supplied. Thus, this exemplary embodiment may maintain the same brightness (i.e. 800 cd/m$^2$), regardless of the size of the light emitting area, which may be preferred in some embodiments. However, the increase in the light emitting area size may result in a proportional increase the total light output of the device (assuming that the number of additional lighting devices extracted from the housing 301 is proportional to the increase in the light emitting area, and assuming that the each light emitting device has emission characteristics that are relatively the same). As illustrated, the light emitting area increased by a factor of 2, and thus the total light supplied is also indicated as having a proportion increase (i.e. from 2500 lm to 5000 lm).

This exemplary embodiment might, for example, be applicable to use as a window shade that combines the functions of privacy and room lighting. As noted above, the light output of the first device 300 (i.e. the rollable lamp) is proportional to the amount of substrate 304 pulled out of the housing 301.

With reference to FIG. 4, another exemplary embodiment of a first device 400 is shown. This device may comprise a substrate 404 comprising a plurality of lighting devices (such as OLEDs), which may be stored in a rigid housing 401. The housing 401 is shown as comprising a rectangular shape having an opening 402 to extract and receive portions of the substrate 404. As noted above, the lighting devices disposed on the substrate 404 may be rigid or flexible and could therefore be supported on a wide variety of substrates 404 (e.g. the substrate could also be rigid or flexible). As illustrated ion FIG. 4, the substrate 404 is shown as comprising a rigid material.

FIG. 4(a) illustrates the device 400 when the substrate 404 is in a first position. As shown, a portion of the substrate 404 is located within the housing 401, while another portion of the substrate 404 (which may comprise a portion of the plurality of lighting devices disposed on the substrate 404) is located outside of the housing 401. As shown in this exemplary embodiment, only the lighting devices disposed on the substrate 404 that are located outside of the housing 401 are energized. In this exemplary embodiment, the light emitting area is illustrated has having an area of 0.1 m$^2$, having a brightness of 800 cd/m$^2$, and having a total light supplied value of 250 lm.

FIG. 4(b) shows the device 400 wherein the substrate 404 is in a second position relative to a support (which may comprise the housing 401). That is, for instance, a force may have been applied to the substrate 404 in the direction indicated by the arrow 403 such that additional sections of the substrate 404 (and the lighting devices that are disposed thereon) have been extracted from the housing 401 through the opening 402. In this case, the additional lighting devices that are now exposed outside of the housing 401 may be energized by the energizing component of the first device 500. The light emitting area in this exemplary embodiment shown in FIG. 4(*b*), as illustrated, may thereby be larger than the light emitting area shown in FIG. 4(*a*). For instance, the light emitting area may comprise an area of 0.2 m$^2$, it may comprise a luminance of 800 cd/m$^2$, and it may comprise 500 lm of total light supplied.

Similar to the exemplary illustration shown in FIG. 3, the lumen output of the device is proportional to the amount of substrate 404 exposed from (i.e. pulled out from) the housing 401. This embodiment shown in FIG. 4 may be particularly applicable to a task light or a novelty lamp, which typically have a relatively small light emitting area in comparison to, for instance, window blinds that comprise a light emitting area. In both embodiments shown in FIGS. 3 and 4, the part of the substrate that is within the housing is not illuminated, and the lighting devices disposed thereon do not draw power.

With reference to FIG. 5, an exemplary panel layout 500 is provided for illustration purposes only. As shown, the light emitting area of the substrate (i.e. the lamp area) may comprise a plurality of lighting devices 506 (which may, for instance comprise a plurality of OLEDs). The plurality of lighting devices 506 may be divided into a number of portions 501-505. As illustrated in this exemplary embodiment, the portions 501-505 of the plurality of lighting devices 506 are divided into rows, which may, for example comprise patterning either the anode or the cathode of a plurality of OLED devices. Preferably, in some embodiments, each portion 501-505 comprises multiple lighting devices in series, in which case for embodiments comprising OLEDs, both the anode, cathode and organic layers may need to be patterned.

As further illustrated in the exemplary embodiment shown in FIG. 5, each of the portions 501-505 of the plurality of lighting devices 506 is electrically connected to a common conductor 510, which may be held at a reference voltage (such as ground). The portions 501-505 are also selectively connected to a voltage rail 514 by sliding contacts 512 (which are also electrical contacts). The voltage rail 514 may be set to a constant voltage, which may be supplied by conductor 513 (which may not make direct electrical contact with the portions 501-505 of the plurality lighting devices 506). As the substrate is moved in the downward direction in FIG. 5, the sliding contacts 512 may contact the voltage rail 514. When this occurs, a current (that may be controlled by the current driver 511) may energize the lighting devices 506 of the portions 501-505. The voltage rail 514 may extend as far as the substrate (or at least the furthest portions 501-505). As shown in FIG. 5, the portions 501 and 502 of the plurality of lighting devices 506 are shown as "ON" based on the corresponding sliding contacts 512 shown as contacting the voltage rail 514, whereas the portions 503-505 of the plurality of lighting devices 506 are shown as "OFF" because the sliding contacts 512 corresponding to these portions are not contacting the voltage rail 514. In this manner, each of the portions 501-505 may be individually energized based on the position of the substrate. Moreover, as illustrated, each of the portions 501-505 is switchably connected in parallel with one another. In addition, as the substrate is moved back (i.e. in the upward direction) the electrical contact between the sliding contacts 512 and the voltage rail 514 may be disconnected.

Embodiments such as those shown in FIG. 5 may provide advantages such as higher voltage, lower current operation and redundancy if individual lighting devices (such as OLEDs) fail short. However, embodiments are not so limited, and each portion 501-505 may comprise a single lighting device (i.e. OLED), or a plurality of devices connected in series, parallel, or some combination thereof. Each of these embodiments may require different patterning of some or all of the various electrode layers and organic layers of the OLEDs, such patterning methods being well known to those skilled in the art. Thus, the exemplary embodiments as shown in FIG. 5 may provide a panel layout 500 that may provide constant brightness operation of the variable area illumination device.

With reference to FIG. 6, an exemplary panel layout 600 is provided for illustration purposes only. The panel 600 is similar to the exemplary panel layout shown in FIG. 5, except that the portions 601-605 of the plurality of lighting devices 606 are selectively connected to a voltage rail 614 via individual switches 612. Embodiments may thereby remove the need for a voltage rail (such as voltage rail 514 in FIG. 5) that extends the full length of the extended (e.g. unrolled) substrate (even when the device is not fully extended—i.e. rolled up). As the substrate is moved in the downward direction in FIG. 6 as shown by the arrow (e.g. it is unrolled), the switch 612 for each portion 601-605 may be activated as it passes the opening in the housing (or otherwise is disposed in a position to be activated). Conversely, each switch 612 may be deactivated as the respective portion 601-605 of the plurality of lighting devices 606 passes into the housing (or is otherwise disposed in a position to be deactivated). As described above, the switches 612 may be either mechanical or electronic, and in the latter case may, for instance, be made from semiconducting components. Mechanical switches can be activated and deactivated by, for instance, physical protrusions at the opening of the housing. Electronic switches can be activated similarly, or by, for example, capacitive or inductive proximity switches mounted on the opening of the housing. However, any method of activating and deactivating mechanical or electronic switches or circuits may be used.

The exemplary panel layout 600 shown in FIG. 6 also comprises conductor 610, which may be held at a reference voltage (such as ground) and may or may not be common to the portions 601-605. As illustrated, the panel 600 also comprises current driver 611 that may be used to control the current supplied to each of the portions 601-605 of the plurality of lighting devices. However, it should be understood that embodiments are not so limited, and any suitable method of providing and/or controlling the current or voltage (e.g. using current or voltage sources) may be used to energize the lighting devices.

It should be understood that either of the exemplary panels shown in FIGS. 5 and 6 may be utilized for a flexible or rigid devices and/or substrates. As shown and described above, either of the exemplary devices illustrated therein may be utilized to provide for constant brightness for a device that comprises variable light emitting area.

With reference to FIG. 7, another exemplary panel layout 700 is shown. Similar to the exemplary panel layouts shown in FIGS. 5 and 6, the exemplary device may comprise a plurality of lighting devices 705 (shown as the cross-hatched elements in FIG. 7). The panel layout 700 also similarly comprises a plurality of portions 701-704 of the lighting devices 705.

However, as shown, the exemplary embodiment in FIG. 7 differs from the exemplary embodiment shown in FIGS. 5 and 6 at least in that it illustrates an embodiment in which the portions 701-704 of the lighting devices are switchably connected in series. That is, for instance, as the portions 701-704 are moved in the direction of arrow 730 (and are extracted or removed from the housing 720), the portions 701-704 are switchably connected in series with each other via switches 710-712. For example, portion 701 is shown as connected in series with portion 702 via switch 710. A complete circuit is created by the electrical contact formed between portion 701 with conductor 722 (which may be set to a reference voltage such as ground) and the electrical connection provided by switch 711 between portion 702 and conductor 711 (which may be set to a predetermined voltage or current level). In this manner, in the exemplary embodiment as shown, the portions 701 and 702 are shown as being energized by a current. As the substrate is further moved in the direction of arrow 730, portion 703 of the plurality of lighting devices 705 may be disposed outside of the housing 720. At this point, in some embodiments, switch 711 will be activated so to electrically connect portions 702 and 703 in series. The connection to the power source 720 is then provided by switch 712. If the substrate were moved in the direction opposite of arrow 730, then, for example, after portion 702 enters the housing 720, switch 710 may be activated so as to connect the portion 701 to the voltage source 721 (and thereby electrically disconnect portions 701 and 702 from series connection). Thus, the portions 701-704 may be switchably connected in series based on the position of the substrate. It should be understood that this exemplary display is provided for exemplary purposes, and other methods of forming switchable series connections may be used.

In addition, FIG. 7 also illustrates that the portions 701-704 of the plurality of lighting devices 705 may each comprise a plurality of lighting devices electrically connected in parallel (see for example portions 701 and 703). FIG. 7 also illustrates the concept that portions 701-704 of the plurality of lighting devices 705 may comprise a single lighting device (see e.g. 702 and 704) and also that the portions 701-704 and/or lighting devices 705 need not be identical. Again, as was described in detail above, the lighting devices and their corresponding portions may be connected in any suitable manner.

With reference to FIG. 8, an exemplary driving unit 800 that may comprise a component of a first device is disclosed for illustration purposes. In particular, FIG. 8 shows an exemplary embodiment of an 8-row OLED driver that is capable of energizing portions of a light emitting area based on the relative position of a substrate. However, principles and discussions provided herein may be applicable to devices that comprise lighting devices other than OLEDs.

As illustrated, the exemplary driving unit 800 comprises four sections: (1) Sensing Module 801; (2) Control Module 802; (3) Power Supply 803; and (4) OLED Drivers 804 (which may be connected to the portions of the plurality of OLEDs in this exemplary embodiment). In this exemplary embodiment, the substrate (or portions thereof) may be wrapped around a rod or shaft (either apart from or in conjunction with a housing). Thus, the Sensing Module 801 comprises a rotary encoder 805 connected to the rod or shaft that the substrate is wrapped around. Depending on the degree of rotation of the rod or shaft, the rotary encoder 805 may send electrical pulses to the Control Module 802 (which may comprise a micro-controller 806). The Control Module 802 may utilize the received signals to determine which driver/drivers 804 to activate. For example, if substrate is wrapped around the shaft for 8 revolutions and each revolution corresponds to one portion of the plurality of lighting devices (i.e. the device comprises eight portions of the plurality of lighting devices). As the substrate is moved (i.e. pulled out), the rotary encoder 805 and/or Sensing Module 801 will send signals to the Control Module 802 indicating the degree of rotation. Once a 360 degree rotation is detected, the Control Module 802 will activate Port 13 of the micro-controller 806 which then activates current source 1 (i.e. OLED Divers 804 (which may comprise, for instance a voltage source or a current source)) to turn on (i.e. energize) the first portion of the plurality of lighting devices (e.g. one or more OLEDs). As the substrate is moved (i.e. pulled out) further, more portions of the plurality of lighting devices will be activated. In this example, eight OLED drivers may be provided (corresponding to potentially eight portions of the plurality of lighting devices). The micro-controller 806 used in this example is PIC 16C54 and OLED driver 804 is 4015 Boospuck. It should be understood that different components may be used and that this is for illustration purposes only. In addition, the micro-controller 806 can be replaced with other components such as mechanical switch, digital or analog IC, and discreet components.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art after reading this disclosure. It is understood that various theories as to why the invention works are not intended to be limiting.

A recitation of "a", "an" or "the" is intended to mean "one or more" unless specifically indicated to the contrary.

What is claimed is:

1. A first device, comprising:
a support;
a first substrate movably coupled to the support;
a plurality of lighting devices disposed on the first substrate, wherein the plurality of lighting devices comprises a first portion of lighting devices and a second portion of lighting devices, and
an energizing component, wherein the energizing component is configured to selectively energize the first portion and the second portion of lighting devices based on a position of the first substrate relative to the support,
wherein a first, a second, and a third position are defined for the first substrate relative to the support,
wherein the energizing component is configured to energize neither the first portion nor the second portion of lighting devices when the first substrate is in the first position,
wherein the energizing component is configured to energize the first portion but not the second portion of lighting devices when the first substrate is in the second position,
wherein the energizing component is configured to energize both the first portion and the second portion of lighting devices when the first substrate is in the third position,
wherein the support comprises a rod,
wherein the first portion and the second portion of the plurality of lighting devices substantially wrap around the rod when the first substrate is in the first position,
wherein the second portion but not the first portion of the plurality of lighting devices substantially wrap around the rod when the first substrate is in the second position, and wherein both the first portion and the second portion of the plurality of lighting devices do not substantially wrap around the rod when the first substrate is in the third position.

2. The first device of claim 1, wherein the first portion and the second portion of the plurality of lighting devices are switchably connected in parallel with each other.

3. The first device of claim 1, wherein the first portion and the second portion of the plurality of lighting devices are switchably connected in series with each other.

4. The first device of claim 1, wherein at least the first portion or the second portion of lighting devices comprises a single lighting device.

5. The first device of claim 1,
wherein the first portion of the plurality of lighting devices comprises a plurality of lighting devices electrically connected in a first series,
wherein the second portion of the plurality of lighting devices comprises a plurality of lighting devices electrically connected in a second series; and
wherein the first and the second series are switchably connected in parallel with each other.

6. The first device of claim 1, wherein the plurality of lighting devices further comprises a third portion of lighting devices; and
wherein the energizing component is configured to selectively energize the first portion, the second portion, and the third portion of lighting devices based on a position of the substrate relative to the support.

7. The first device of claim 1, wherein the plurality of lighting devices comprises a plurality of OLEDs, and wherein each of the plurality of OLEDs comprises:
a first electrode;
a second electrode disposed over the first electrode; and
an organic electroluminescent (EL) material disposed between the first and the second electrodes.

8. The first device of claim 1, wherein the plurality of lighting devices comprises a plurality of LEDs.

9. The first device of claim 1, wherein the support comprises a housing that is configured to selectively contain or expose the first and second portions of lighting devices disposed on the first substrate.

10. The first device of claim 9,
wherein the energizing component is configured to energize the first portion of lighting devices when the first portion of lighting devices is not contained within the housing,
wherein the energizing component is configured to not energize the first portion of lighting devices when the first portion of lighting devices is contained within the housing,
wherein the energizing component is configured to energize the second portion of lighting devices when the second portion of lighting devices is not contained within the housing; and
wherein the energizing component is configured to not energize the second portion of lighting devices when the second portion of lighting devices is contained within the housing.

11. The first device of claim 1, wherein the energizing component comprises:
a first contact electrically connected to the first portion of lighting devices;
a second contact electrically connected to the second portion of lighting devices; and
a third contact electrically connected to at least one of a voltage source or a current source;
wherein the third contact does not electrically connect to either the first or the second contact when the first substrate is in the first position;
wherein the third contact electrically connects to the first contact but not the second contact when the first substrate is in the second position; and
wherein the third contact electrically connects to the first contact and the second contact when the first substrate is in the third position.

12. The first device of claim 11, wherein the third contact comprises an electrical conductor that extends in a direction that is substantially parallel to the direction that the substrate moves when going from the first position to the second or the third position.

13. The first device of claim 11, wherein the third contact comprises a plurality of switches, and wherein each switch is selectively connected to a voltage source, a current source, or a plurality of lighting devices.

14. The first device of claim 13, wherein each switch selectively connects a plurality of lighting devices to at least one of a voltage source or a current source.

15. The first device of claim 13,
wherein the plurality of switches comprises a first switch and a second switch;
wherein the first switch selectively connects the first contact to at least one of a voltage source or a current source when activated;
wherein the second switch selectively connects the second contact to at least one of a voltage source or a current source when activated;
wherein the first switch and the second switch are not activated when the first substrate is in the first position;
wherein the first switch is activated and the second switch is not activated when the first substrate is in the second position; and
wherein the first switch and the second switch are activated when the first substrate is in the third position.

16. The first device of claim 15,
wherein the support comprises a housing configured to selectively contain some or all of the first substrate,
wherein the housing comprises an opening for receiving some or all of the substrate; and
wherein the first and the second switches are activated by at least one of a physical protrusion, a capacitance switch, or a proximity switch located at or near the opening of the housing.

17. The first device of claim 1, wherein the energizing component comprises a driving unit, and wherein the driving unit comprises:
a sensing module configured to determine the position of the first substrate;
a control module configured to determine to which of the plurality of lighting devices to supply current based on the position of the first substrate;
a power supply; and
one or more lighting device drivers that are electrically connected to the plurality of lighting devices, wherein the lighting device drivers are configured to control the brightness of the plurality of the lighting devices.

18. The first device of claim 1, wherein the first device comprises a task lamp or a novelty lamp.

19. A first device, comprising:
a support;
a first substrate movably coupled to the support;
a plurality of portions of lighting devices disposed on the first substrate, wherein each portion comprises one or more lighting devices; and an energizing component, wherein the energizing component is configured to selectively energize each of the portions of lighting devices based on a position of the first substrate relative to the support, wherein the support comprises a rod;

wherein the portions of the first substrate comprising the plurality of portions of lighting devices are configured to selectively wrap around the rod;

wherein the energizing component is configured to energize the portions of lighting devices that are not substantially wrapped around the rod; and wherein the energizing component is configured to not energize the portions of the lighting devices that are substantially wrapped around the rod.

20. The first device of claim 19, wherein the support comprises a housing configured to selectively contain the portions of the substrate that comprise the plurality of portions of lighting devices; and wherein the energizing component is configured to energize the portions of lighting devices that are not contained with the housing; and wherein the energizing component is configured to not energize the portions of the lighting devices that are contained within the housing.

* * * * *